(12) United States Patent
Yoshikawa et al.

(10) Patent No.: US 9,357,660 B2
(45) Date of Patent: May 31, 2016

(54) PRINTED CIRCUIT BOARD, AND METHOD FOR MANUFACTURING PRINTED CIRCUIT BOARD

(71) Applicant: IBIDEN CO., LTD., Ogaki-shi (JP)

(72) Inventors: Kazuhiro Yoshikawa, Ogaki (JP); Liyi Chen, Ogaki (JP); Toshiki Furutani, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 220 days.

(21) Appl. No.: 14/067,080

(22) Filed: Oct. 30, 2013

(65) Prior Publication Data

US 2014/0118976 A1    May 1, 2014

(30) Foreign Application Priority Data

Oct. 30, 2012    (JP) .................................. 2012-239201

(51) Int. Cl.
| | |
|---|---|
| *H05K 1/18* | (2006.01) |
| *H05K 3/46* | (2006.01) |
| *H01L 23/498* | (2006.01) |
| *H01L 23/538* | (2006.01) |
| *H05K 1/16* | (2006.01) |

(52) U.S. Cl.
CPC ........ *H05K 3/4644* (2013.01); *H01L 23/49822* (2013.01); *H01L 23/49827* (2013.01); *H01L 23/5383* (2013.01); *H01L 23/5384* (2013.01); *H01L 23/5389* (2013.01); *H05K 3/4602* (2013.01); *H05K 3/4694* (2013.01); *H01L 2924/0002* (2013.01); *H05K 1/165* (2013.01); *H05K 1/185* (2013.01); *H05K 2201/10015* (2013.01); *H05K 2201/10636* (2013.01); *H05K 2203/1469* (2013.01); *Y02P 70/611* (2015.11); *Y10T 29/4913* (2015.01)

(58) Field of Classification Search
USPC ........... 361/760–766, 792–795; 174/259–264
See application file for complete search history.

(56) References Cited

U.S. PATENT DOCUMENTS

| | | | |
|---|---|---|---|
| 7,187,250 B2* | 3/2007 | Matters-Kammerer . | H03H 7/48 333/112 |
| 2010/0090781 A1* | 4/2010 | Yamamoto .............. | H01L 23/66 333/167 |
| 2012/0212919 A1* | 8/2012 | Mano ..................... | H05K 1/185 361/782 |

FOREIGN PATENT DOCUMENTS

JP    2009-111261    5/2009

* cited by examiner

*Primary Examiner* — Tuan T Dinh
(74) *Attorney, Agent, or Firm* — Oblon, McClelland, Maier & Neustadt, L.L.P.

(57) ABSTRACT

A printed wiring board includes a core substrate having opening, an electronic component device accommodated in the opening of the substrate and including inductor and passive components, a wiring structure connecting the inductor and passive components in the electronic device, a filler resin body filling space formed between the substrate and electronic device in the opening of the substrate, a first buildup layer including a first interlayer insulation layer on first surface of the substrate, a first conductive layer on the first insulation layer, and a first via conductor in the first insulation layer, and a second buildup layer including a second interlayer insulation layer on second surface of the substrate on the opposite side of the first surface of the substrate, a second conductive layer on the second insulation layer, and a second via conductor in the second insulation layer.

18 Claims, 31 Drawing Sheets

FIG. 4
(A)
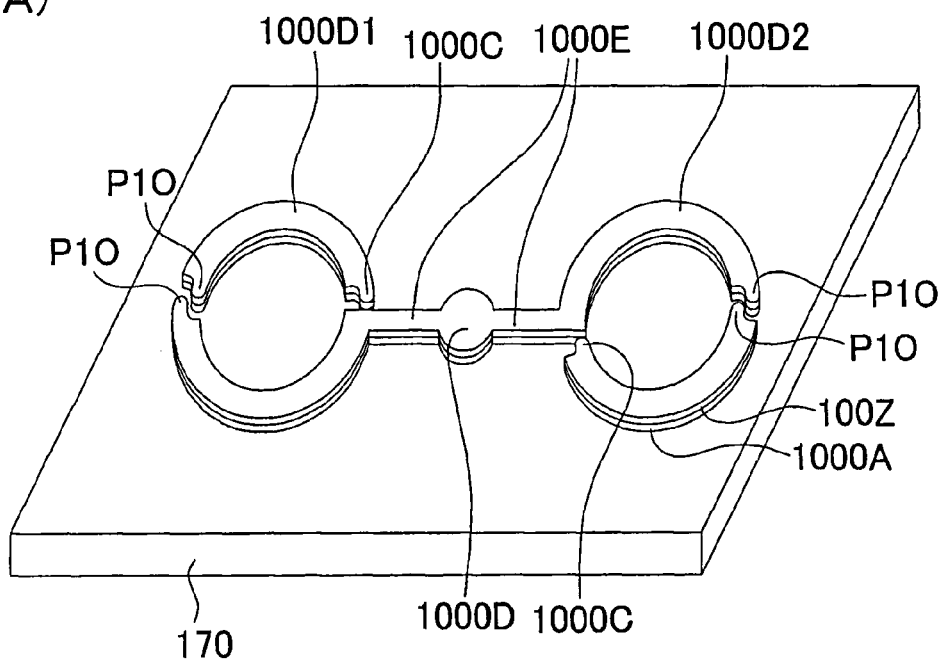
(B)
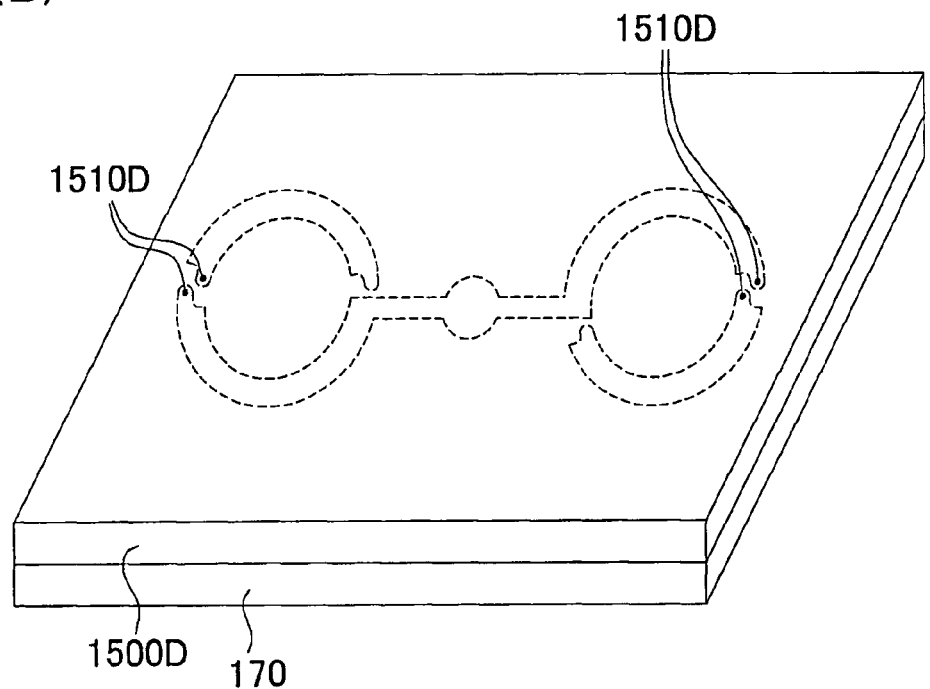

FIG. 5
(A)
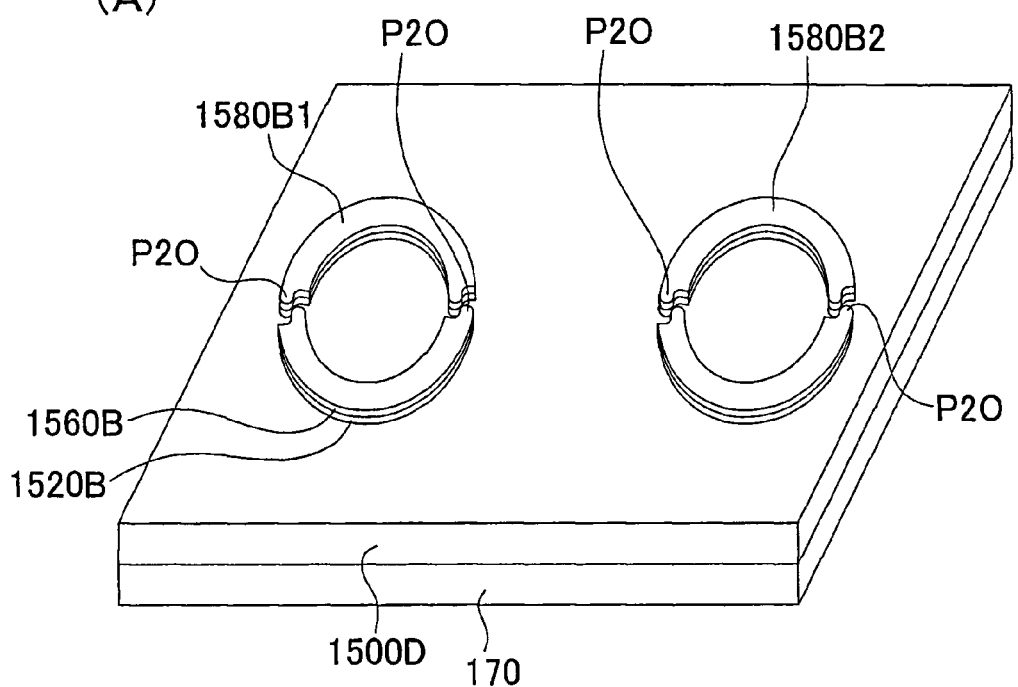
(B)
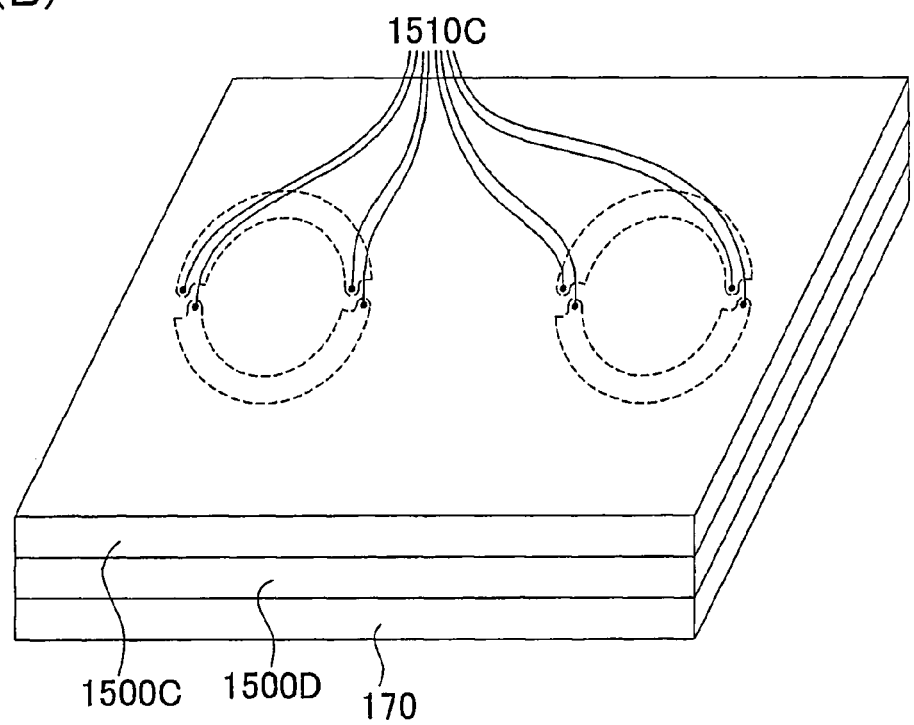

FIG. 7
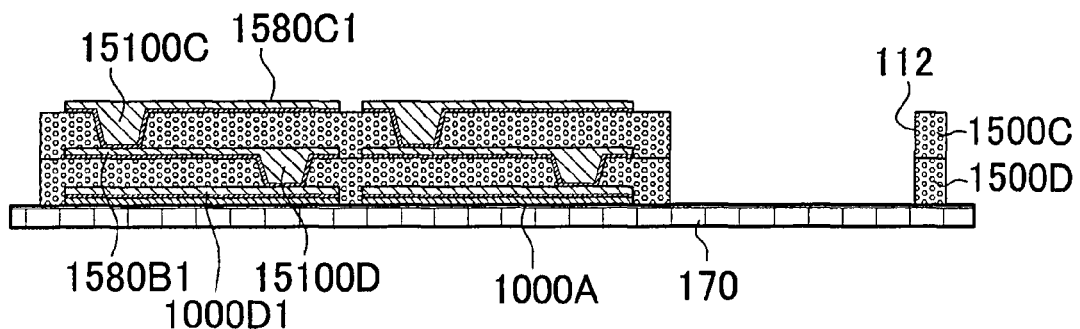
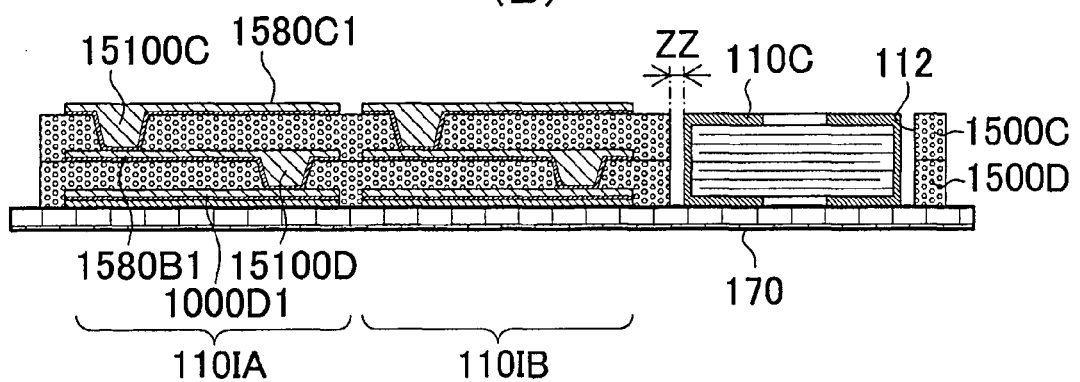
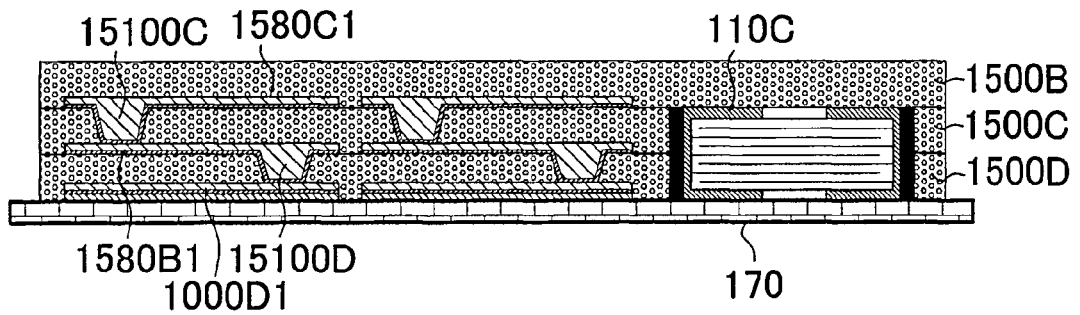

FIG. 8
(A)
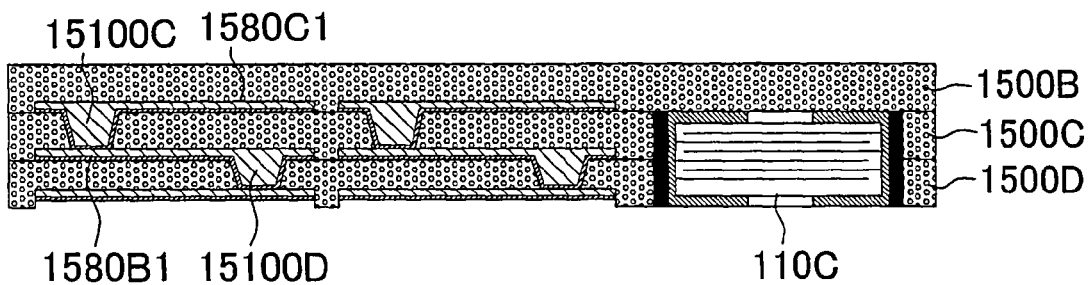
(B)
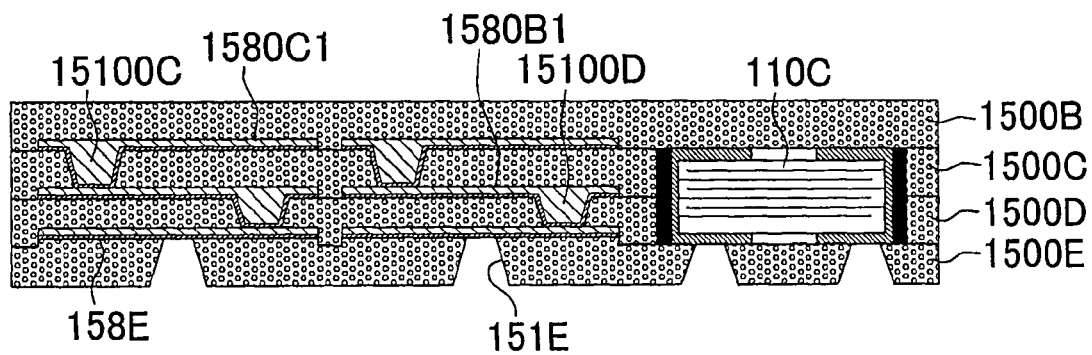
(C)
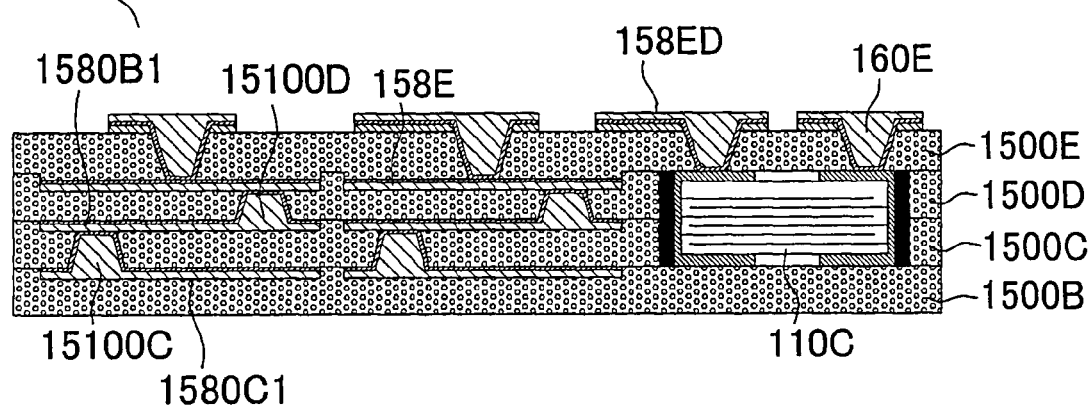

FIG. 14
(A)
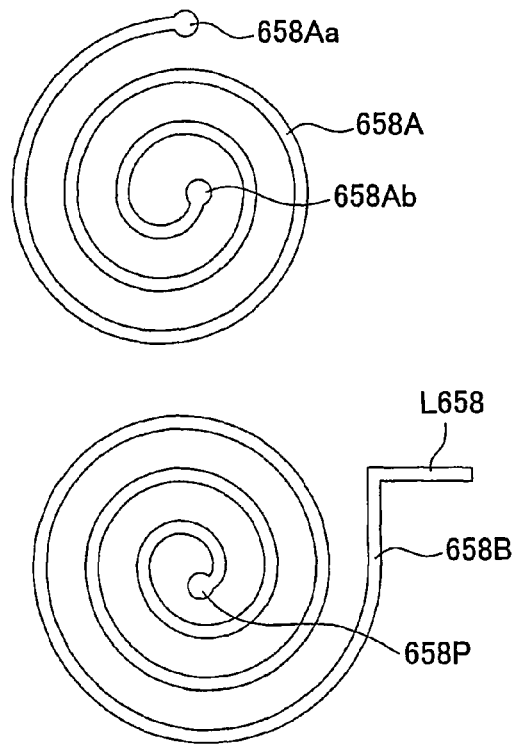
(B)
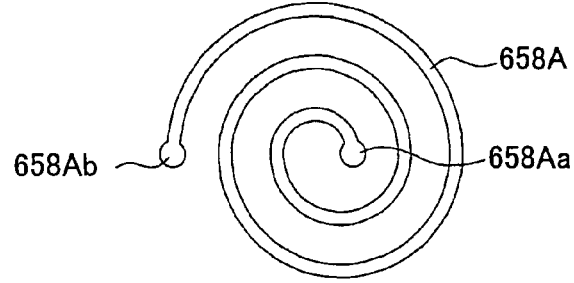
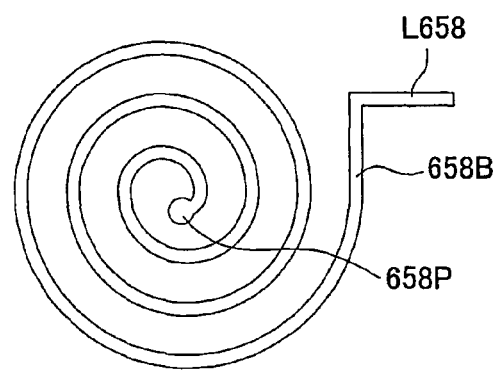

FIG. 18
(A)
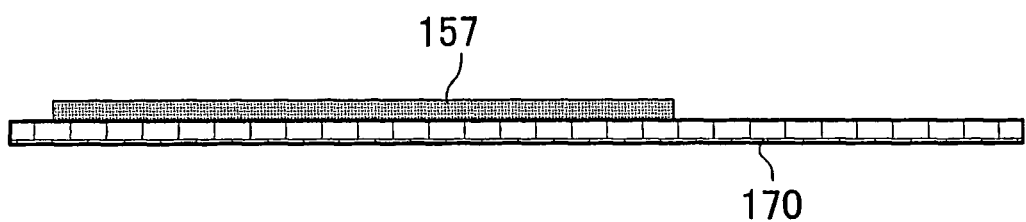
(B)
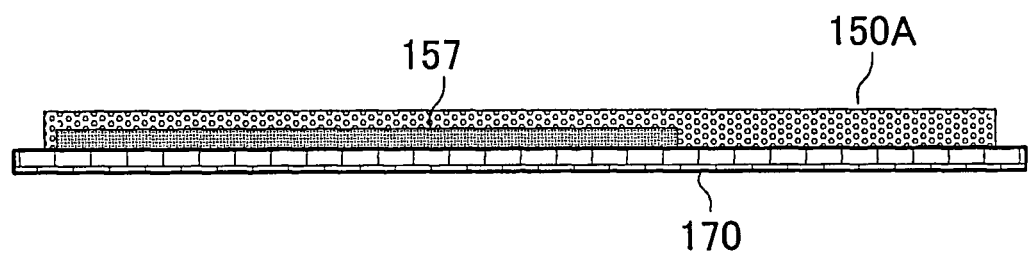

FIG. 19
(A)
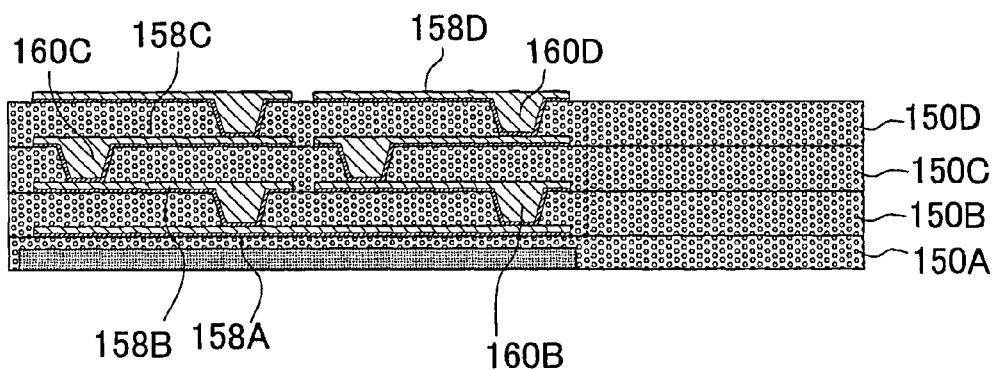
(B)
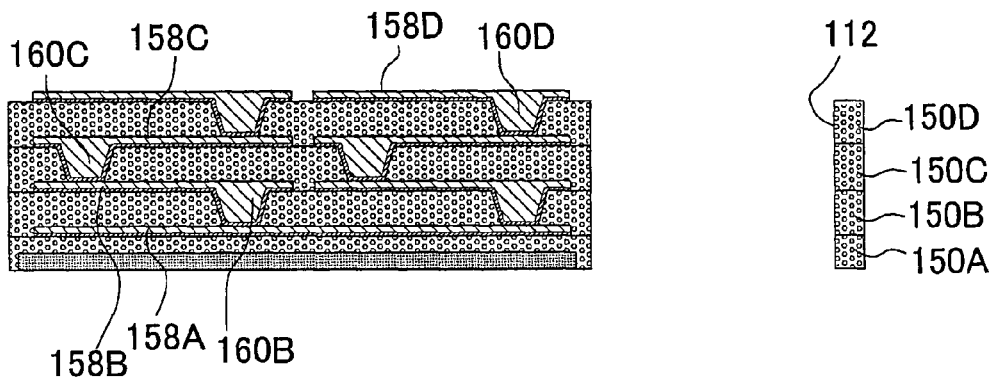
(C)
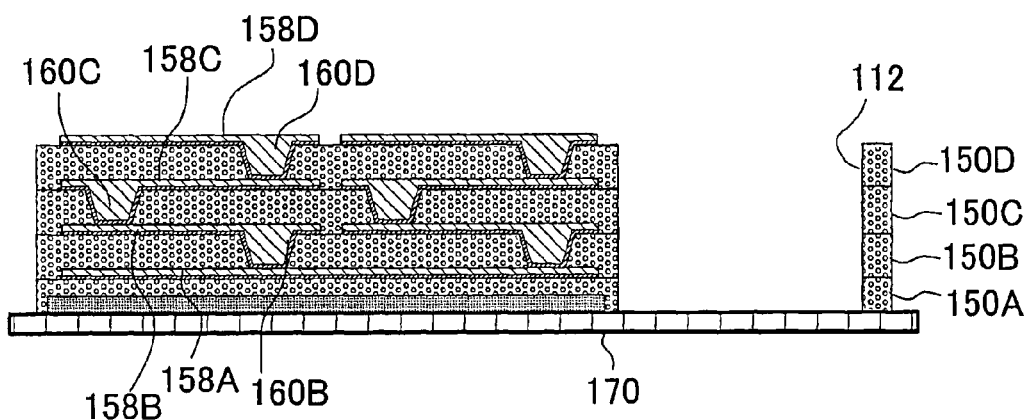

FIG. 20
(A)
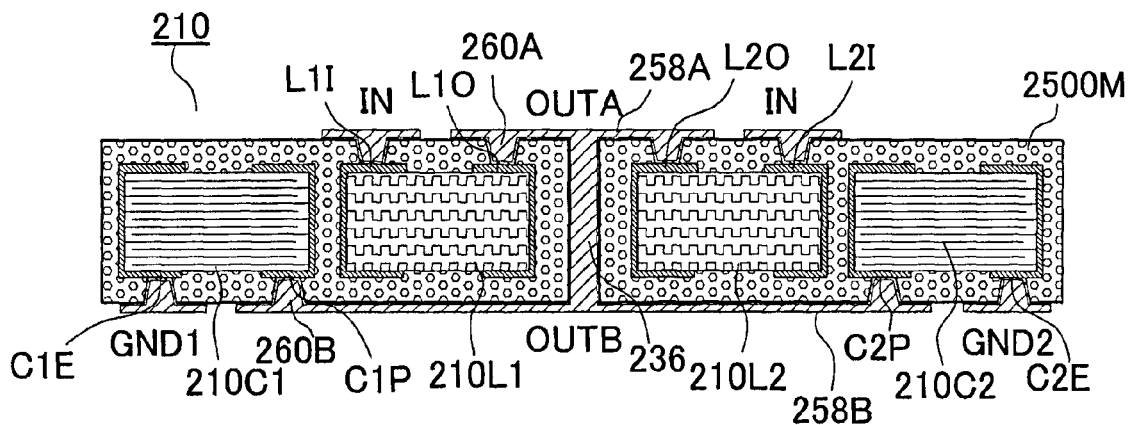
(B)
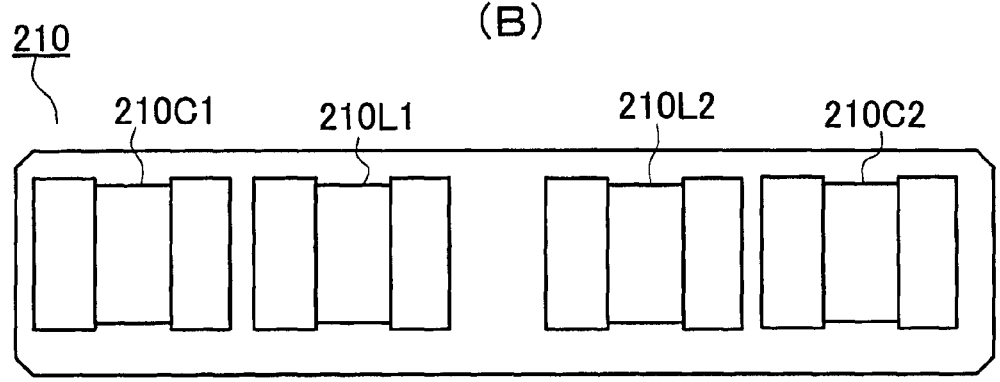
(C)
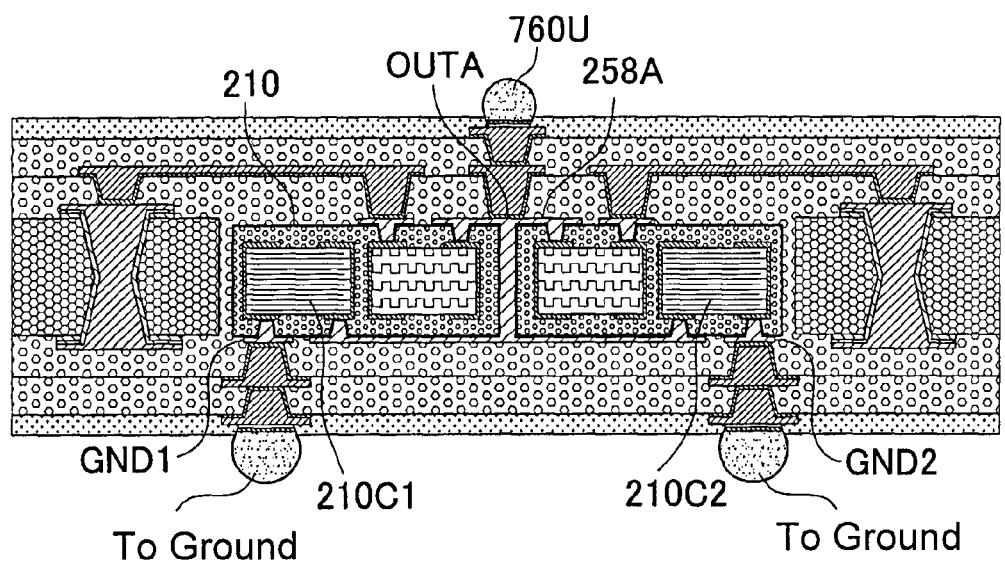

FIG. 22
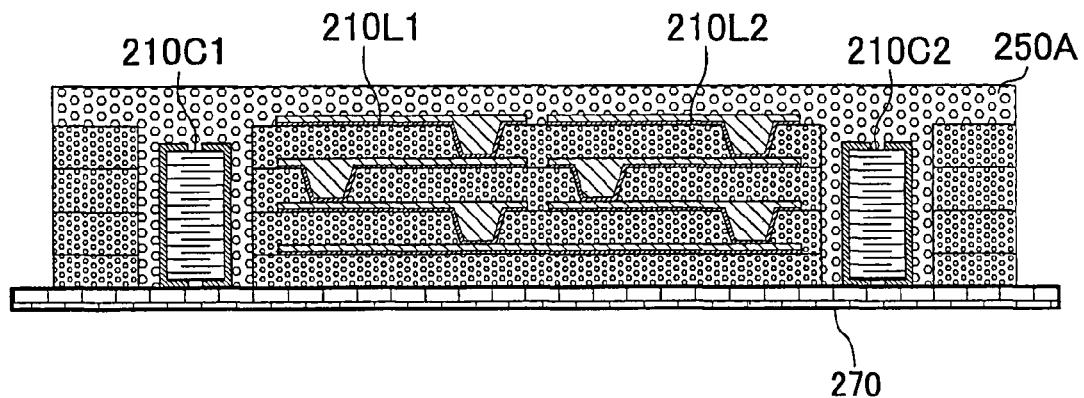
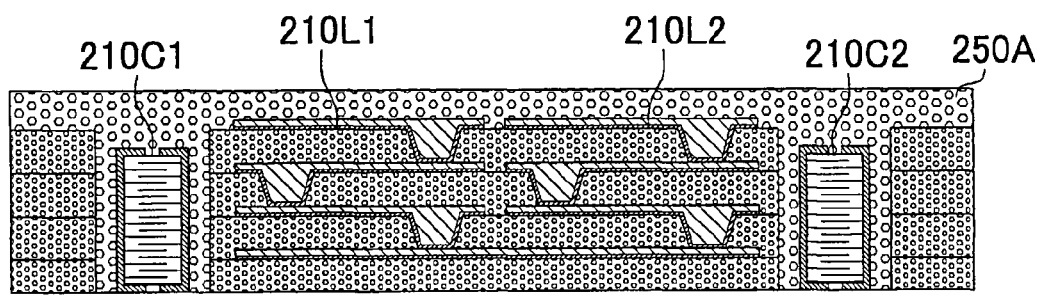
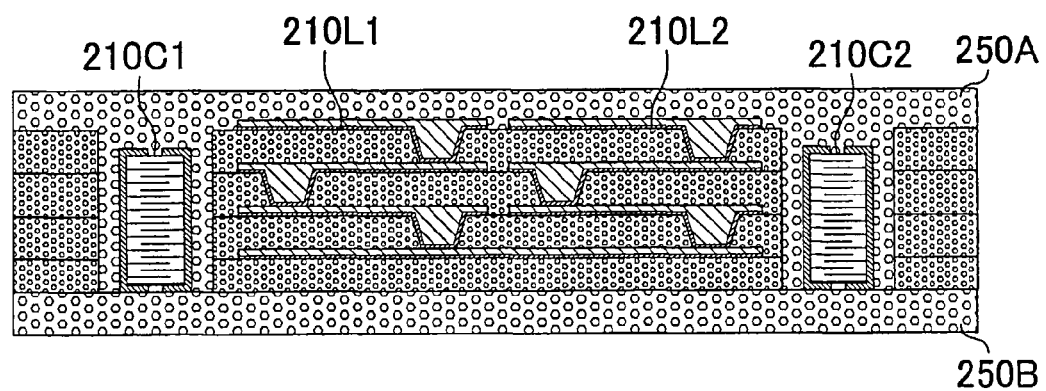

FIG. 27
(A)
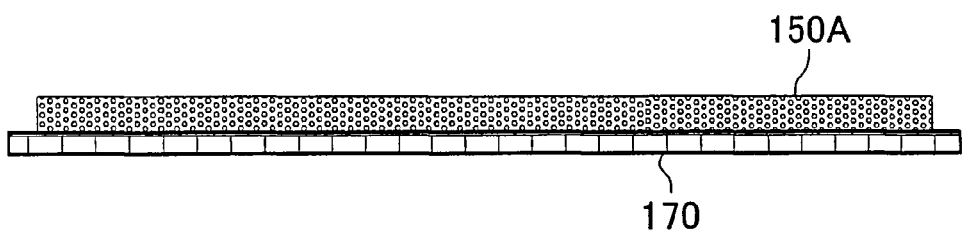
(B)
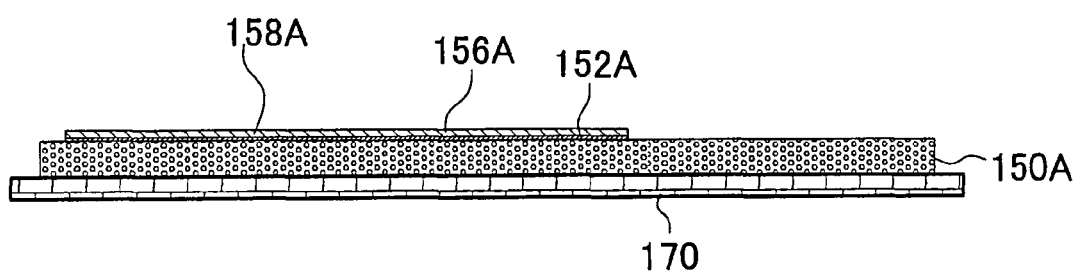
(C)
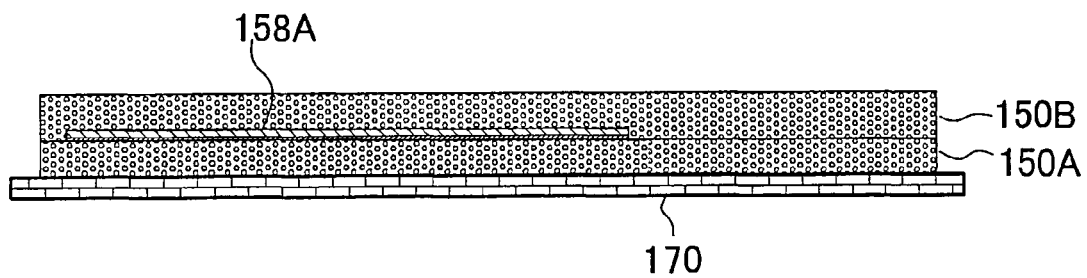

FIG. 28
(A)
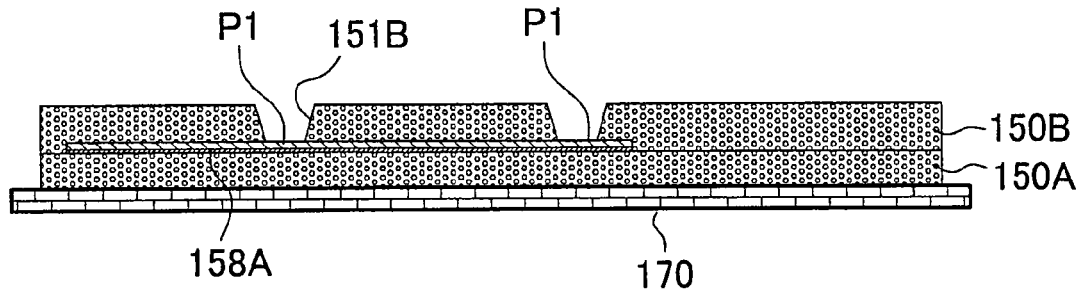
(B)
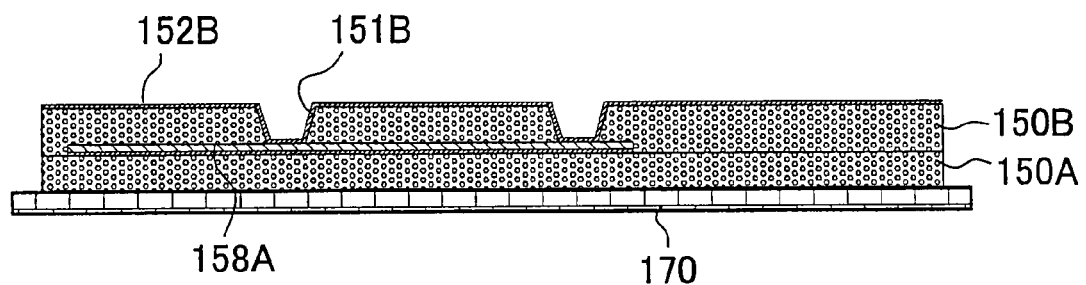
(C)
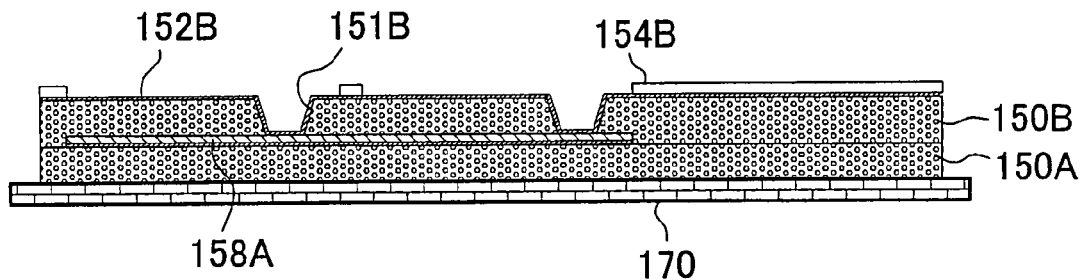

FIG. 31
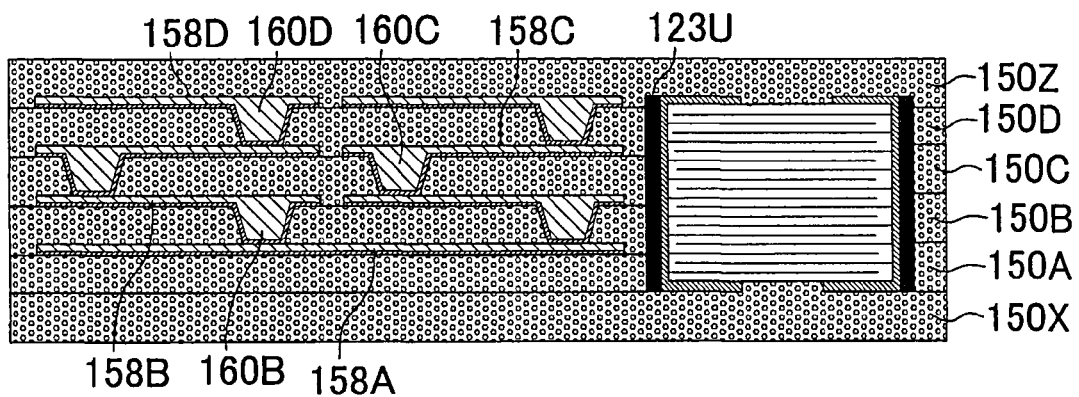
(A)
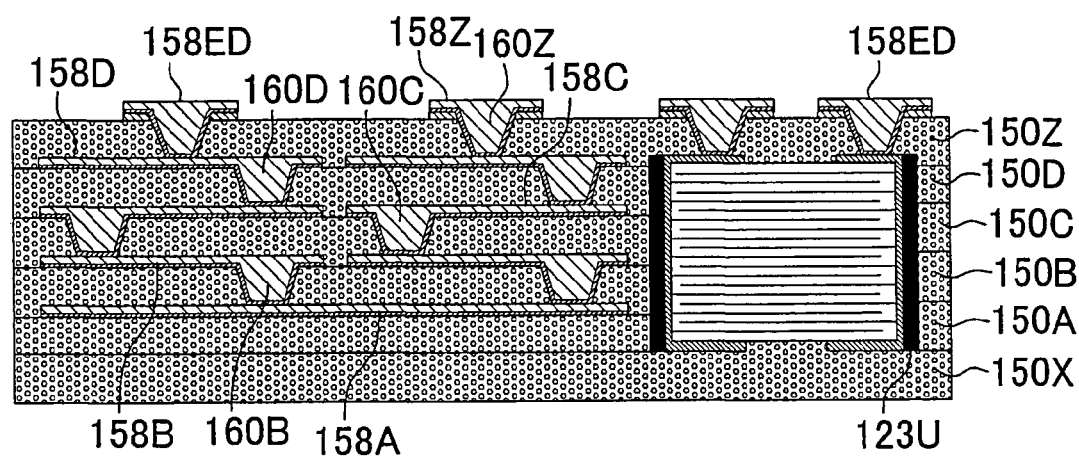
(B)

PRINTED CIRCUIT BOARD, AND METHOD FOR MANUFACTURING PRINTED CIRCUIT BOARD

CROSS-REFERENCE TO RELATED APPLICATIONS

The present application is based upon and claims the benefit of priority to Japanese Patent Application No. 2012-239201, filed Oct. 30, 2012, the entire contents of which are incorporated herein by reference.

BACKGROUND OF THE INVENTION

1. Field of the Invention

The present invention relates to an electronic component formed of an inductor and a passive component, a printed circuit board accommodating the electronic component, and a method for manufacturing the printed circuit board.

2. Description of Background Art

JP 2009-111261 A describes a multilayer printed circuit board having an inductor and a capacitor. The multilayer printed circuit board illustrated in FIG. 1 of JP 2009-111261 A has first, second and third insulation layers. The multilayer printed circuit board has an inductor between the second and third insulation layers, and has a capacitor located at an end of the first insulation layer not in contact with the inductor. The entire contents of this publication are incorporated herein by reference.

SUMMARY OF THE INVENTION

According to one aspect of the present invention, a printed circuit board includes a core substrate having an opening portion, an electronic component device accommodated in the opening portion of the core substrate and including an inductor component and a passive component, a wiring structure connecting the inductor component and the passive component in the electronic component device, a filler resin body filling a space formed between the core substrate and the electronic component device positioned in the opening portion of the core substrate, a first buildup layer including a first interlayer resin insulation layer formed on a first surface of the core substrate, a first conductive layer formed on the first interlayer resin insulation layer, and a first via conductor formed in the first interlayer resin insulation layer, and a second buildup layer including a second interlayer resin insulation layer formed on a second surface of the core substrate on an opposite side with respect to the first surface of the core substrate, a second conductive layer formed on the second interlayer resin insulation layer, and a second via conductor formed in the second interlayer resin insulation layer.

According to another aspect of the present invention, a built-in electronic component device for a printed circuit board includes a capacitor component, an inductor component including a resin insulation layer and a coil layer formed on the resin insulation layer, and a resin body integrating the capacitor component and the inductor component.

According to yet another aspect of the present invention, a method for manufacturing a printed circuit board includes forming an opening portion in an insulation substrate, accommodating into the opening portion of the insulation substrate an electronic component device including an inductor component and a passive component, forming on a first surface of the insulation substrate a first buildup layer including a first interlayer resin insulation layer, a first conductive layer formed on the first interlayer resin insulation layer, and a first via conductor formed in the first interlayer resin insulation layer, and forming on a second surface of the core substrate on the opposite side with respect to the first surface of the insulation substrate a second buildup layer including a second interlayer resin insulation layer, a second conductive layer formed on the second interlayer resin insulation layer, and a second via conductor formed in the second interlayer resin insulation layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 4(A)-4(B) are process views illustrating a method for manufacturing the electronic component of the first embodiment;

FIGS. 5(A)-5(B) are process views illustrating the method for manufacturing the electronic component of the first embodiment;

FIGS. 7(A)-7(C) are process views illustrating the method for manufacturing the electronic component of the first embodiment;

FIGS. 8(A)-8(C) are process views illustrating the method for manufacturing the electronic component of the first embodiment;

FIGS. 14(A)-14(B) are plan views illustrating uppermost and lowermost coil layers of a laminated coil.

FIGS. 18(A)-18(B) are process views illustrating a method for manufacturing an electronic component of a second embodiment;

FIGS. 19(A)-19(C) are process views illustrating a method for manufacturing an electronic component of the second embodiment;

FIG. 20(A) illustrates a section of an electronic component of a third embodiment, FIG. 20(B) illustrates a plan of the electronic component, and FIG. 20(C) illustrates a printed circuit board of the third embodiment;

FIGS. 22(A)-22(C) are process views illustrating the method for manufacturing the electronic component of the third embodiment;

FIGS. 27(A)-27(C) are process views illustrating a method for manufacturing an electronic component of Example 6;

FIGS. 28(A)-28(C) are process views illustrating the method for manufacturing the electronic component of Example 6;

FIGS. 31(A)-31(B) are process views illustrating a method for manufacturing an electronic component of Example 7.

DETAILED DESCRIPTION OF THE EMBODIMENTS

Figure 1:
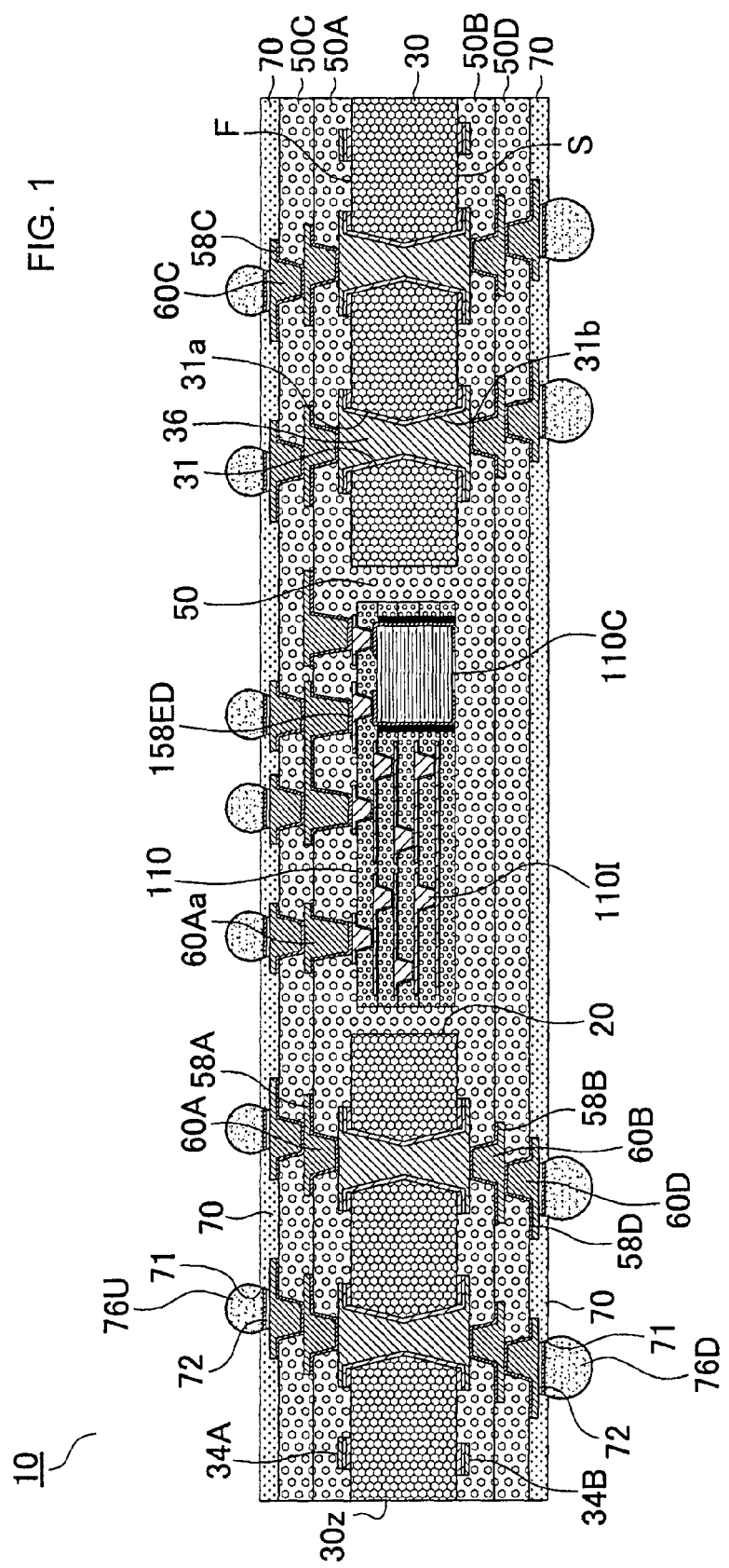
FIG. 1 is a cross-sectional view of a printed circuit board of a first embodiment.

The embodiments will now be described with reference to the accompanying drawings, wherein like reference numerals designate corresponding or identical elements throughout the various drawings.

First Embodiment

FIG. 1 is a cross-sectional view of a printed circuit board 10 according to a first embodiment of the invention. In the printed circuit board 10, a core substrate 30 having a first surface (F) and a second surface (S) opposite the first surface accommodates an electronic component 110. The core substrate has an opening 20 for accommodating the electronic component, and has an insulation substrate (30z) having a first surface (F) and a second surface (S) opposite the first surface, a first conductive layer (34A) on the first surface of the insulation substrate, a second conductive layer (34B) on the second surface of the insulation substrate, and a through-hole conductor 36 connecting the first and second conductive layers (34A, 34B) together. A filler (filler resin) 50 fills a space between an inner wall of the opening 20 and the electronic component.

The through-hole conductor 36 is formed by filling plating film in a through hole 31 formed in the insulation substrate. The through hole 31 is made up of a first opening (31a) formed on a first surface side of the insulation substrate, and a second opening (31b) formed on the second surface side. The first opening (31a) is tapered from the first surface toward the second surface. The second opening (31b) is tapered from the second surface toward the first surface. The first and second openings (31a, 31b) are contiguous to each other inside the insulation substrate.

The first surface of the core substrate corresponds to the first surface of the insulation substrate, and the second surface of the core substrate corresponds to the second surface of the insulation substrate. An upper buildup layer is formed on the first surface (F) of the core substrate 30 and the electronic component. The upper buildup layer has an insulation layer (upper interlayer resin insulation layer) (50A) formed on the first surface (F) of the core substrate 30 and the electronic component, a conductive layer (upper conductive layer) (58A) on the insulation layer (50A), and an upper via conductor (60A) that penetrates through the insulation layer (50A) and connects the first conductive layer and the through-hole conductor to the conductive layer (58A). Further, a connection via conductor (60Aa) connecting an electrode (158ED) of the electronic component and the conductive layer (58A) is formed in the insulation layer (50A). The upper buildup layer further has an insulation layer (uppermost interlayer resin insulation layer) (50C) on insulation layer (50A) the conductive layer (58A), a conductive layer (uppermost conductive layer) (58C) on the insulation layer (50C), and an uppermost via conductor (60C) that penetrates through the insulation layer (50C) and connects the conductive layer (58A) and the via conductor (60A or 60Aa) to the conductive layer (58C). The upper via conductor (60A) includes the connection via conductor (60Aa).

A lower buildup layer is formed on the second surface (S) of the core substrate 30 and the electronic component. The lower buildup layer has an insulation layer (lower interlayer resin insulation layer) (50B) formed on the second surface (S) of the core substrate 30 and the electronic component, and a conductive layer (lower conductive layer) (58B) on the insulation layer (50B), and a lower via conductor (60B) that penetrates through the insulation layer (50B) and connects the second conductive layer and the through-hole conductor to the conductive layer (58B). The lower buildup layer further has an insulation layer (lowermost interlayer resin insulation layer) (50D) on the insulation layer (50B) and the conductive layer (58B), the conductive layer (lowermost conductive layer) (58D) on the insulation layer (50D), and a lowermost via conductor (60D) that penetrates through the insulation layer (50D) and connects the conductive layer (58B) and the via conductor (60B) to the conductive layer (58D).

A solder-resist layer 70 having openings 71 is formed on each of the upper and lower buildup layers. Upper surfaces of the conductive layers (58C, 58D) as well as the via conductors (60C, 60D) exposed through the openings in the solder-resist layer function as pads, respectively. A metal film 72 of Ni, Pd, Au or the like is formed on each pad, and a solder bump (76U, 76D) is formed on the metal film. For example, an IC chip is mounted on the printed circuit board through the solder bumps (76U) formed on the upper buildup layer. For example, the printed circuit board is mounted on a mother board through the solder bumps (76D) formed on the lower buildup layer.

In the printed circuit board 10 of the first embodiment, the opening 20 formed in the core substrate 30 accommodates the electronic component 110. The opening 20 is a through hole (opening) 20 that extends from the first surface and reaches the second surface of the insulation substrate. The filler resin 50 fills the through hole 20. The filler resin 50 fills a space between a side wall (a side wall of the insulation substrate exposed through the opening 20) of the opening 20 and the electronic component.

In the first embodiment, since the electronic component is built into the core substrate, the printed circuit board can accommodate the electronic component without increasing the number of the insulation layers in the buildup layer. When a printed circuit board has a built-in electronic component including the inductor in which multiple coil layers and resin insulation layers are alternately layered, the number of the insulation layers (the interlayer resin insulation layers of the upper and lower buildup layers) on the core substrate does not increase according to the first embodiment. Since the core substrate generally has a greater thickness than the insulation layer on the core substrate, even when an electronic component including the inductor having many coil layers is built into the printed circuit board in the first embodiment, that does not increase the number of insulation layers formed on the core substrate. An electronic component containing an inductor of high inductance is built into the thin printed circuit board. In the first embodiment, it is not necessary to increase the number of the insulation layers (interlayer resin insulation layers) of the buildup layer for internally arranging the coil in the printed circuit board. When a coil is formed in the buildup layer by a pattern, the numbers of the insulation layers and the conductive layers increase. This increases the thickness of the printed circuit board. When the coil is formed in the upper or lower buildup layer, the number of layers in the upper or lower buildup layer is liable to increase. Since numbers of the insulation layers and conductive layers on the upper-surface side of the core substrate are different from those on the lower-surface side, the printed circuit board is likely to warp. However, in the first embodiment, the numbers of the insulation layers and the conductive layers on the upper buildup layer are equal to those on the lower buildup layer. Warping of the printed circuit board is minor.

Figure 2:
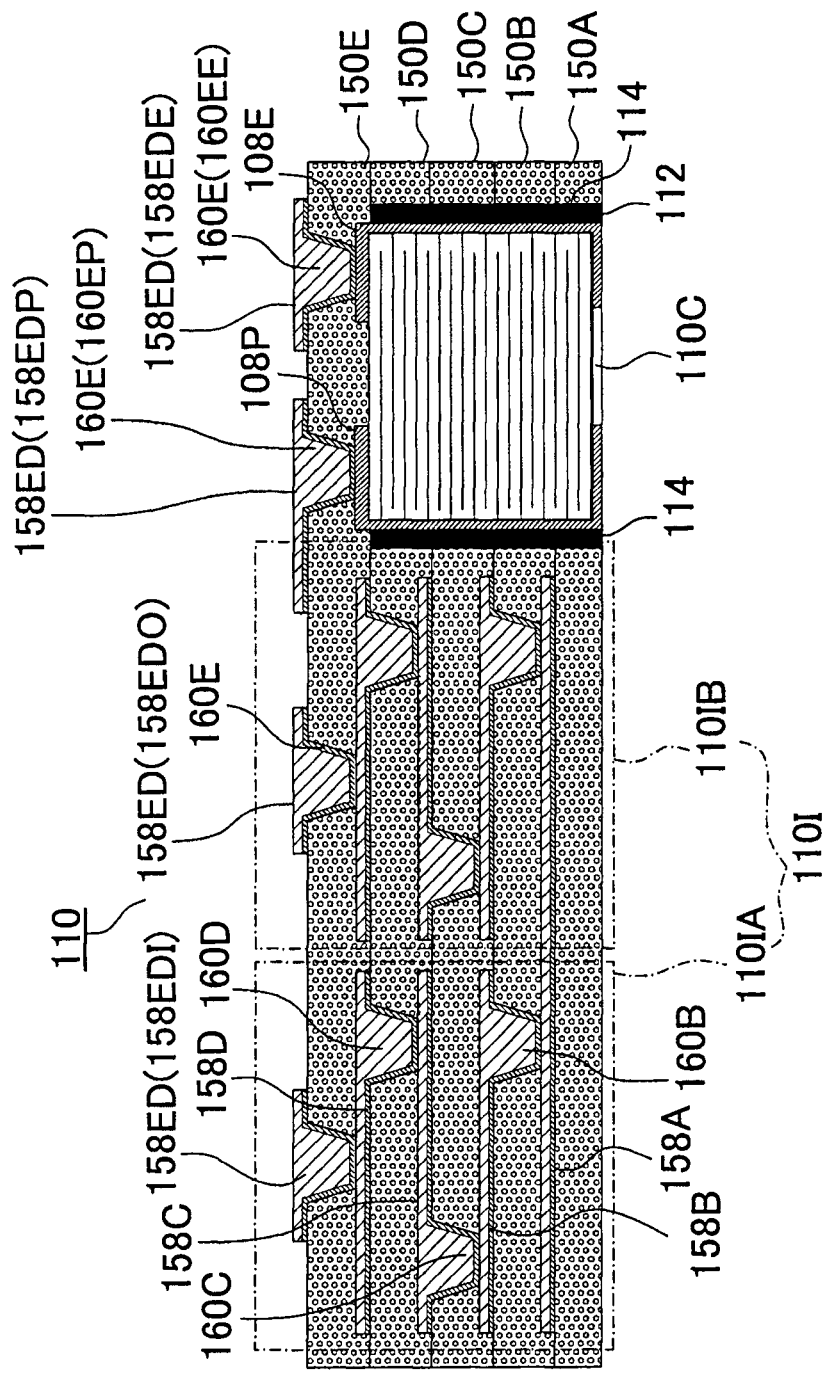
FIG. 2 is a cross-sectional view of an electronic component of the first embodiment.

FIG. 2 is an enlarged view of the electronic component 110 in FIG. 1. The electronic component 110 is formed of an inductor (110I), a passive component (110C), and resin integrating them. The passive component is a resistor, a capacitor or the like. The inductor (110I) has resin insulation layers and coil layers formed on one plane by wiring, and the resin insulation layers and the coil layers are alternately layered. The coil layers formed in the different layers, respectively, are connected by via conductors penetrating through the resin insulation layers. A resin insulation layer illustrated in the uppermost position in FIG. 2 is an uppermost resin insulation layer (150E). The inductor has electrodes (158ED) on the uppermost resin insulation layer. In FIG. 2, the electrode is exposed, and the resin insulation layer and the coating layer are not formed on the electrode. The electronic component is arranged inside the core substrate such that the electrode (158ED) faces the first surface of the core substrate.

The chip capacitor (110C) is accommodated in an opening 112 formed in first, second, third and fourth resin insulation layers (150A, 150B, 150C, 150D). Resin 114 for fixing is formed between the opening 112 and the chip capacitor (110C). The chip capacitor (110C) has a power supply terminal (108P) and a grounding terminal (108E). The power supply terminal (108P) is connected to a power supply electrode (158EDP) through a via conductor (160EP) formed in the fifth resin insulation layer (uppermost resin insulation layer) (150E). The grounding terminal (108E) is connected to a ground electrode (158EDE) through a via conductor (160EE) formed in the fifth resin insulation layer (150E). The connection via conductor (60Aa) of the printed circuit board is connected to the electrode of the inductor or the electrode of the chip capacitor. The connection via conductor may be connected to the via conductor in the electronic component connected to the electrode of the inductor or to the via conductor in the electronic component connected to the electrode of the chip capacitor.

The inductor (110I) has multiple coil layers. A first coil layer (lowermost coil layer) (158A) is formed on the first resin insulation layer (lowermost resin insulation layer) (150A). The second resin insulation layer (150B) is formed on the first coil layer (158A) and the first resin insulation layer, and a second coil layer (158B) is formed on the second resin insulation layer. A via conductor (160B) formed in the second resin insulation layer connects the first and second coil layers (158A, 158B) to each other. The third resin insulation layer (150C) is formed on the second coil layer (158B) and the second resin insulation layer. A third coil layer (158C) is formed on the third resin insulation layer. A via conductor (160C) formed in the third resin insulation layer connects the second and third coil layers (158B, 158C) to each other. The fourth resin insulation layer (150D) is formed on the third coil layer (158C) and the third resin insulation layer. A fourth coil layer (uppermost coil layer) (158D) is formed on the fourth resin insulation layer. A via conductor (160D) formed in the fourth resin insulation layer connects the third and fourth coil layers (158C, 158D) to each other. The fifth resin insulation layer (150E) is formed on the fourth coil layer (158D) and the fourth resin insulation layer. The electrode (158ED) is formed on the fifth resin insulation layer. A via conductor (160E) formed on the fifth resin insulation layer connects the fourth coil layer (158D) and the electrode (158ED) to each other. The connection via conductor (60Aa) of the printed circuit board is formed on the electrode (158ED).

The electronic component of the first embodiment has multiple laminated coils (110IA, 110IB) described above, and the laminated coils are coupled in parallel or in series. The electronic component in FIG. 2 is formed of the two laminated coils ((110IA) at the left in the drawing and (110IB) at the center in the drawing). Each laminated coil is easily connected. The resin insulation layers (150B, 150C, 150D) held between the coil layers may contain magnetic particles of iron-nickel alloy, iron alloy, amorphous alloy, or the like. The inductance increases. The lowermost resin insulation layer may likewise contain magnetic particles. External leakage of magnetic flux from the electronic component is suppressed. The lower buildup layer immediately under the electronic component may be provided with a conductor circuit such as ground or power, and this prevents reduction of the inductance value and increase of the loss. In view of the above, it is preferable that a coating layer made of resin containing magnetic particles is formed on the electrode and the uppermost resin insulation layer. When a conductor circuit of ground or power is formed in the upper buildup layer immediately above the electronic component, reduction of the inductance value and increase of the loss are prevented. The amount of the magnetic particles contained in resin insulation layer is 30 vol. % to 60 vol. %. Mixing of the magnetic particles in the resin insulation layer reduces the numbers of the insulation layers and the conductive layers in the upper and lower buildup layers. Therefore, the thickness of the printed circuit board with the electronic component built into the core substrate can be reduced. In FIG. 2, the coil layer is formed on the uppermost resin insulation layer. However, the coil layer and the electrode may be formed on the uppermost interlayer resin insulation layer.

Magnetic films may cover the upper and lower surfaces of the electronic component, respectively. Further, a magnetic film may be formed on the side wall of the electronic component. The magnetic film covers the electronic component. External leakage of the magnetic flux from the electronic component is suppressed. This reduces regions immediately above and/or below the electronic component where the conductive circuit cannot be formed for preventing reduction of an inductance value and lowering of a Q value. Imbalance of the conductor circuit volume between the upper and lower buildup layers hardly ever occurs. The printed circuit board of which warping is suppressed is provided. The lowermost resin insulation layer may be a magnetic film. When the magnetic films are formed on the uppermost and lowermost coil layers, respectively, the magnetic film is preferred to be formed thereon with a coating layer or a resin insulation layer (magnetic layer) containing magnetic particles interposed therebetween. The magnetic film is made of a magnetic material. The magnetic film is formed, for example, by sputtering. Iron oxide (III) or the like is used as a target.

Figure 3:
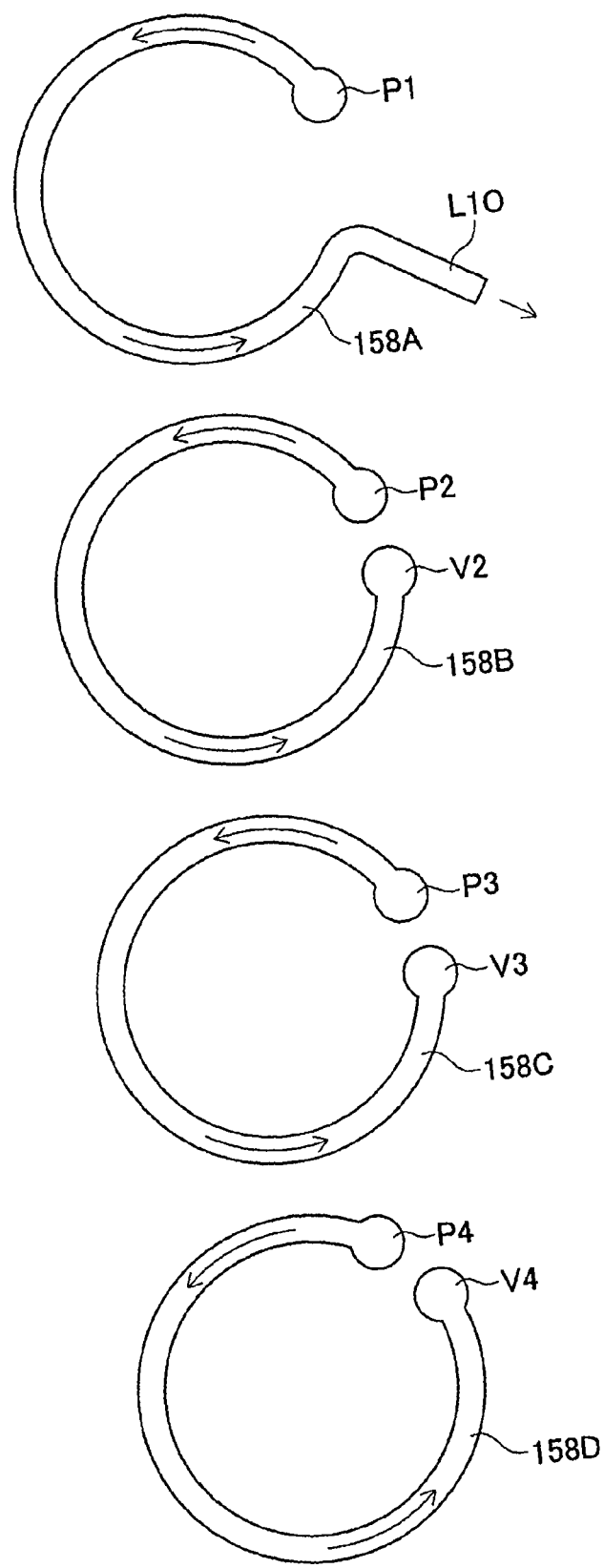
FIG. 3 is a plan view illustrating respective coil layers of an inductor according to the first embodiment.
Figure 6:
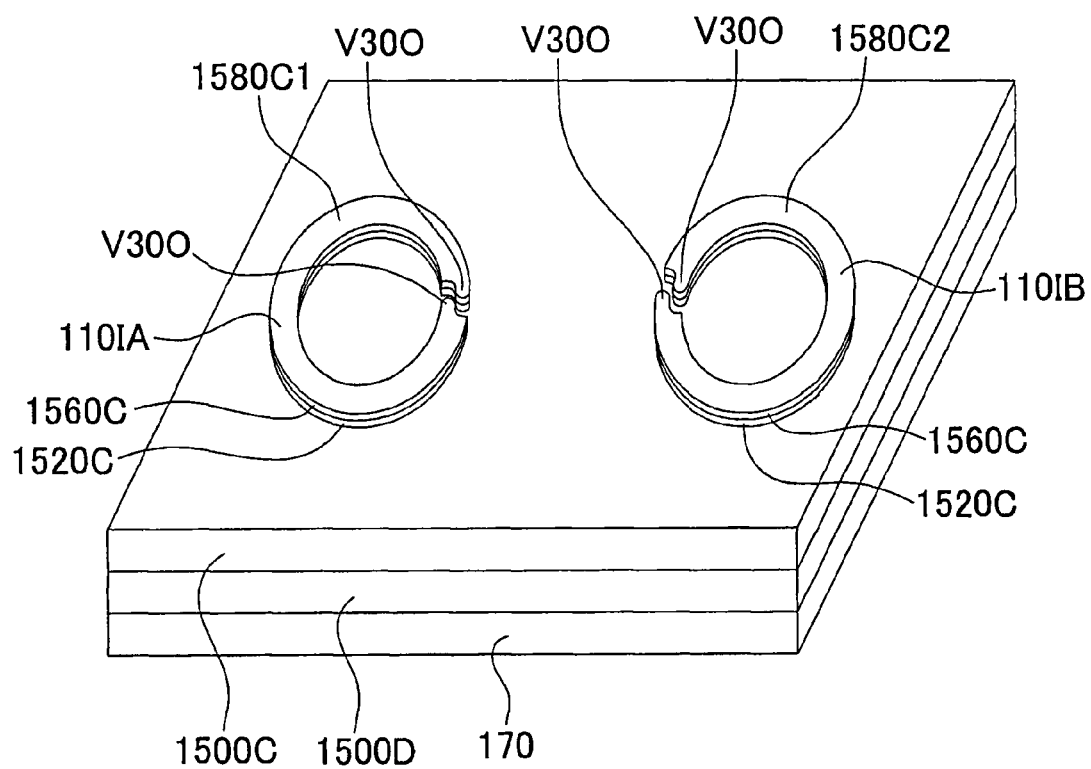
FIG. 6 is a process view illustrating the method for manufacturing the electronic component of the first embodiment.
Figure 9:
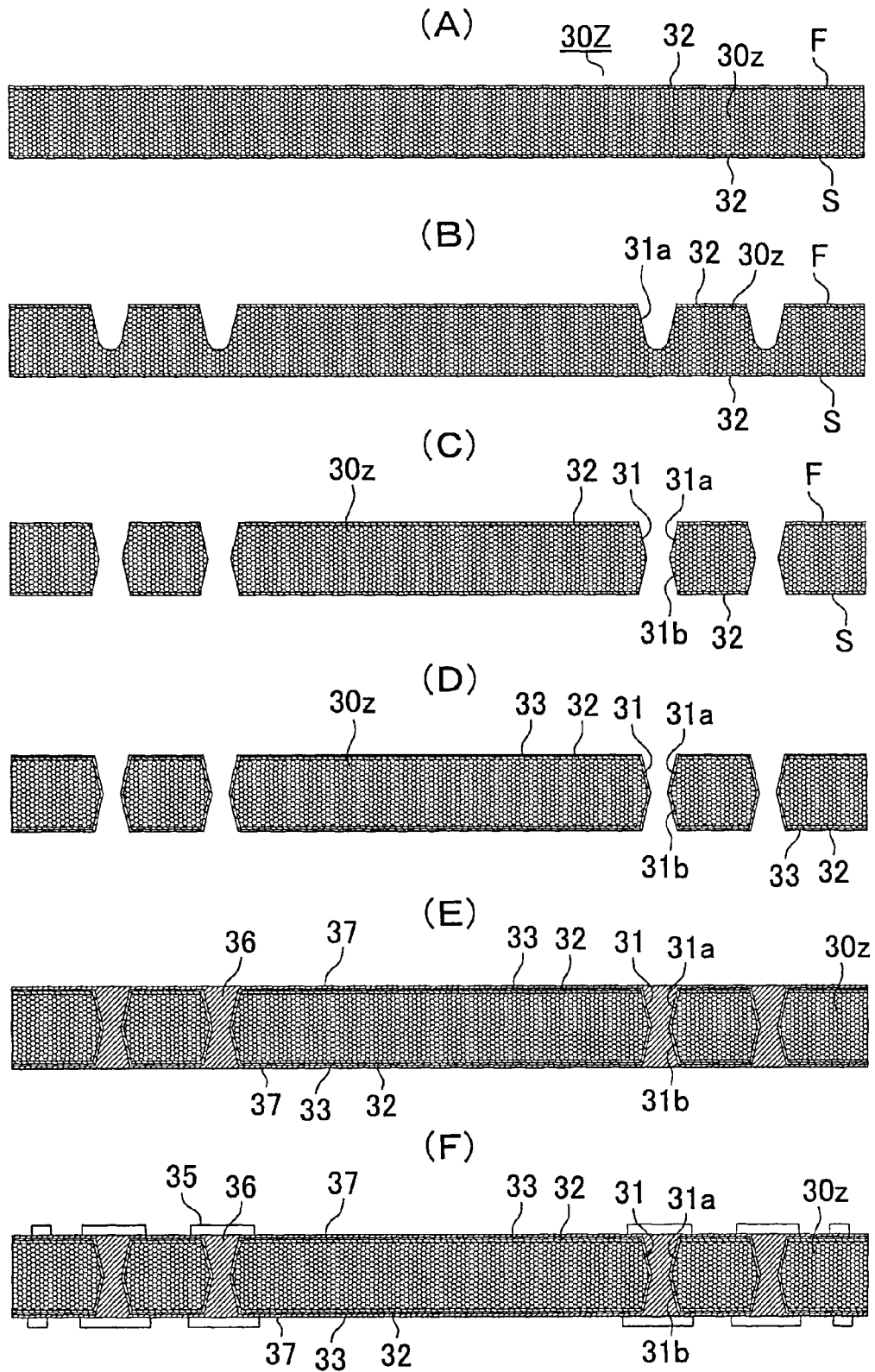
FIGS. 9(A)-9(F) are process views illustrating a method for manufacturing the printed circuit board of the first embodiment.
Figure 10:
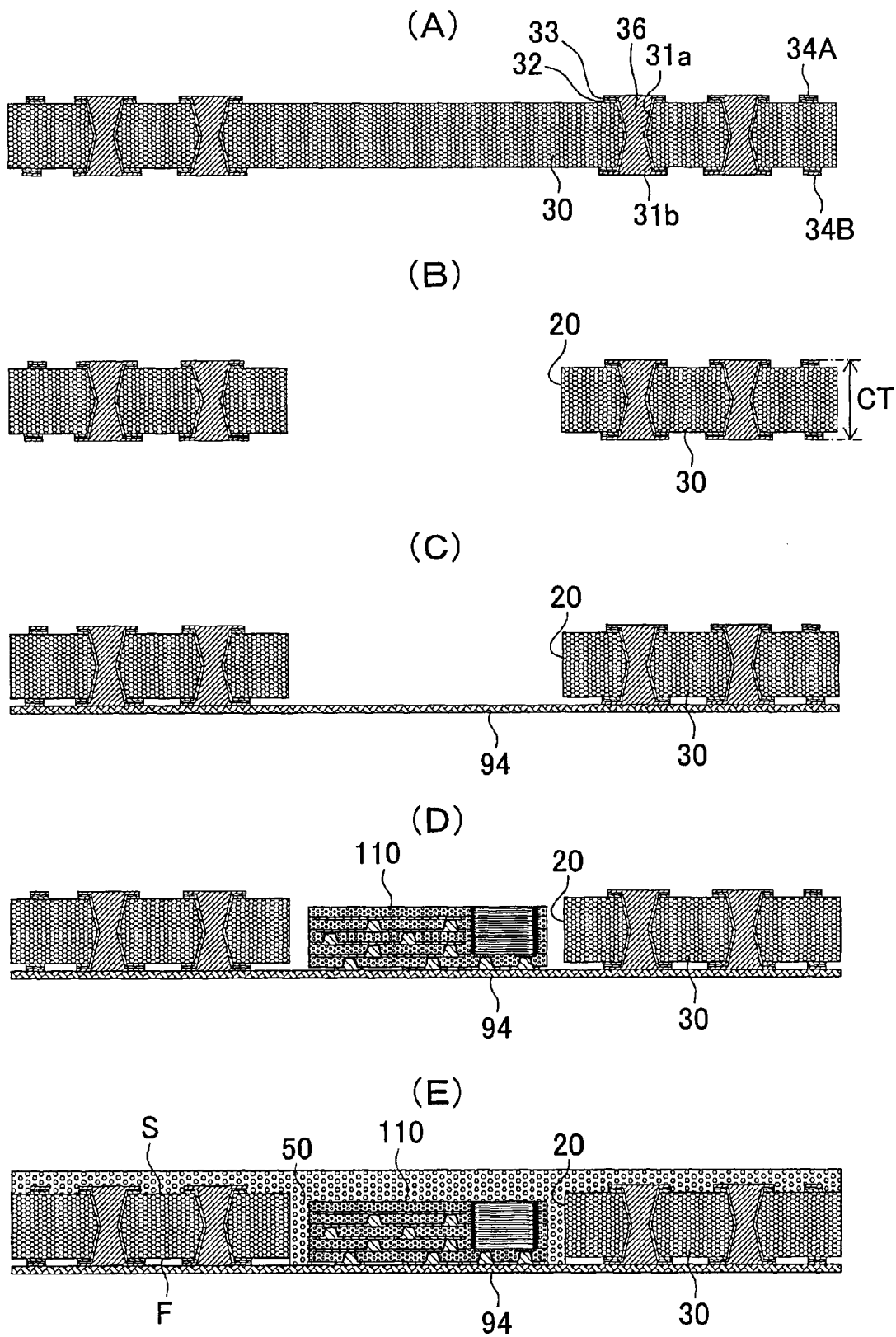
FIGS. 10(A)-10(E) are process views illustrating the method for manufacturing the printed circuit board of the first embodiment.
Figure 11:
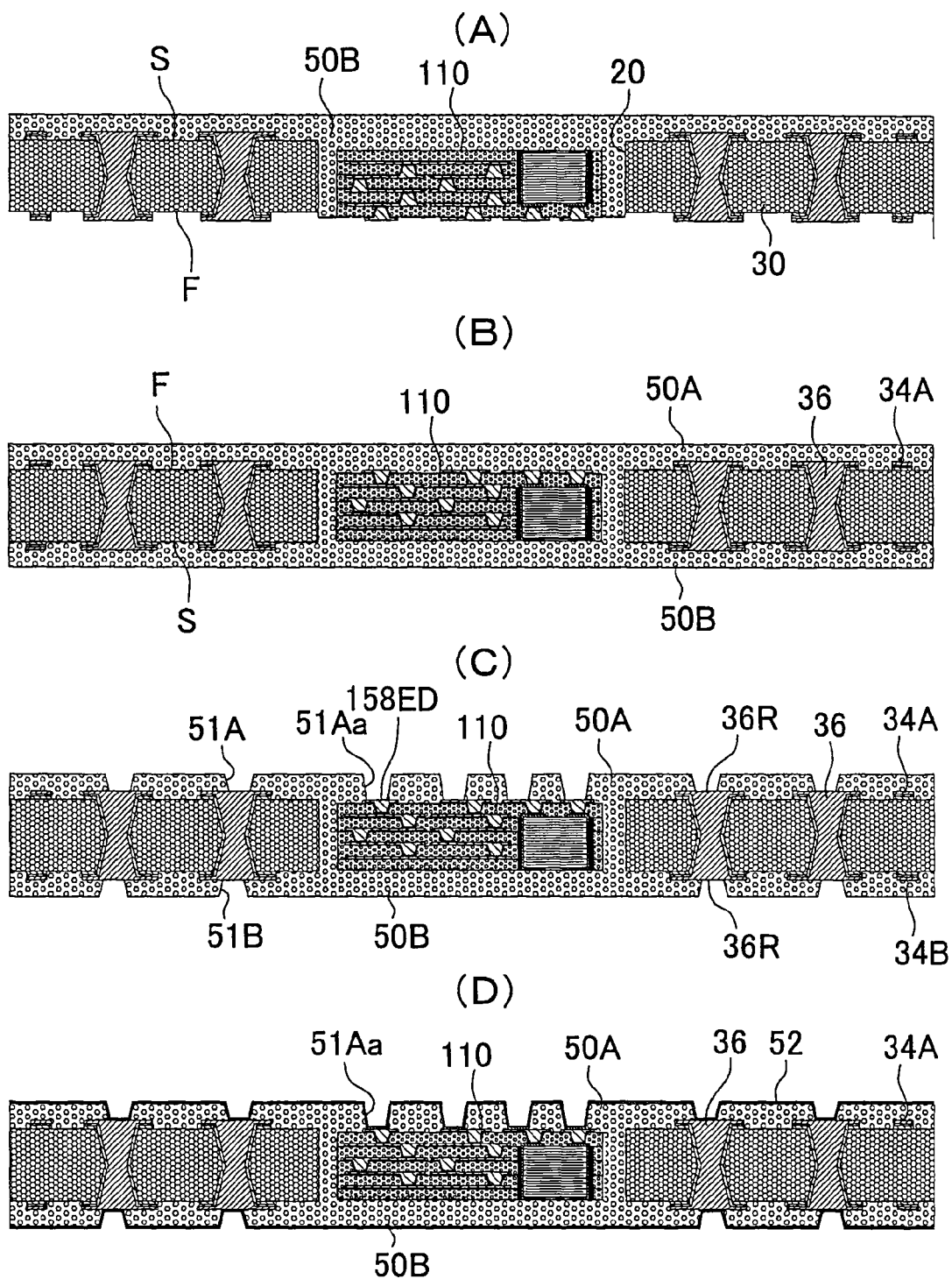
FIGS. 11(A)-11(D) are process views illustrating the method for manufacturing the printed circuit board of the first embodiment.
Figure 12:
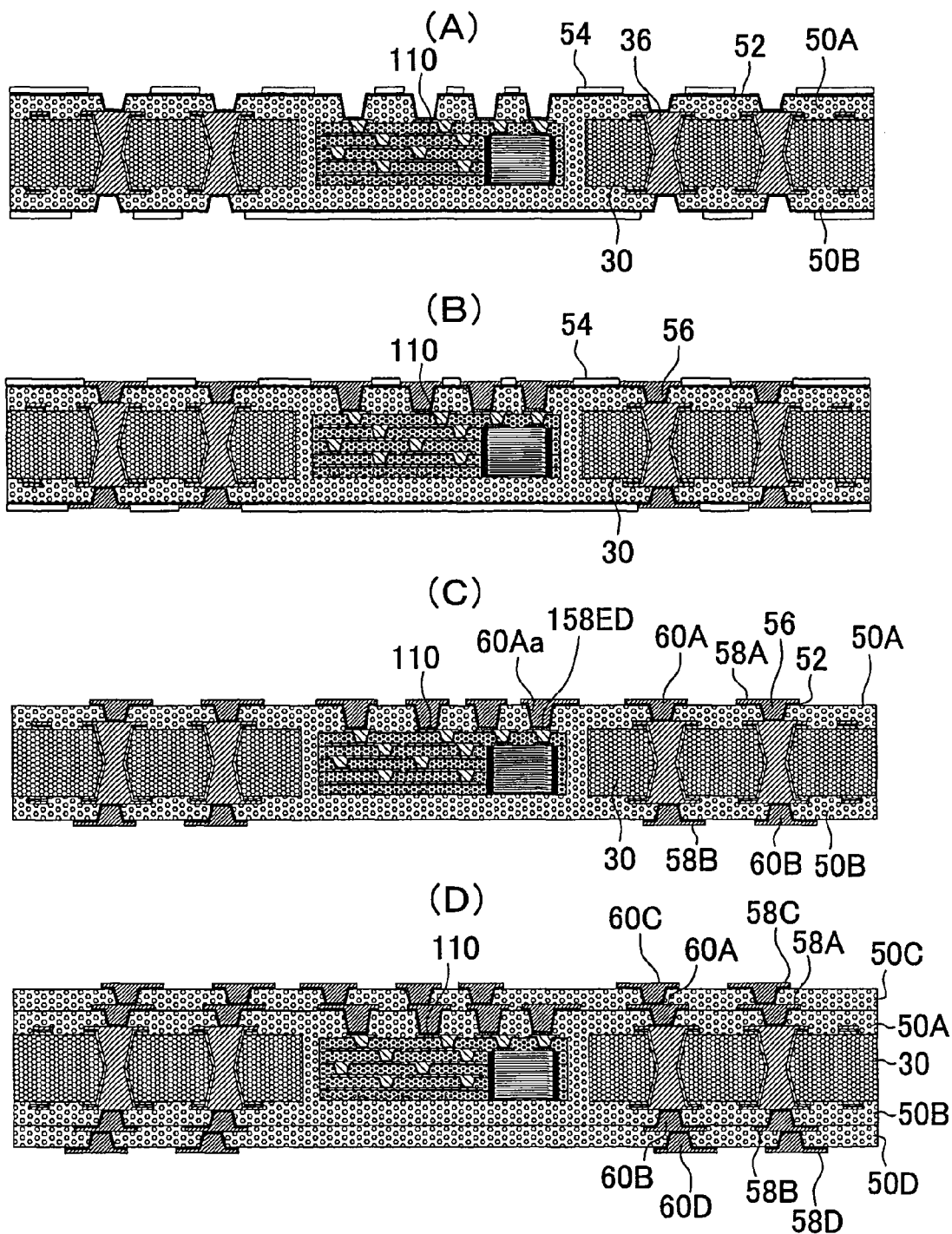
FIGS. 12(A)-12(D) are process views illustrating the method for manufacturing the printed circuit board of the first embodiment.
Figure 13:
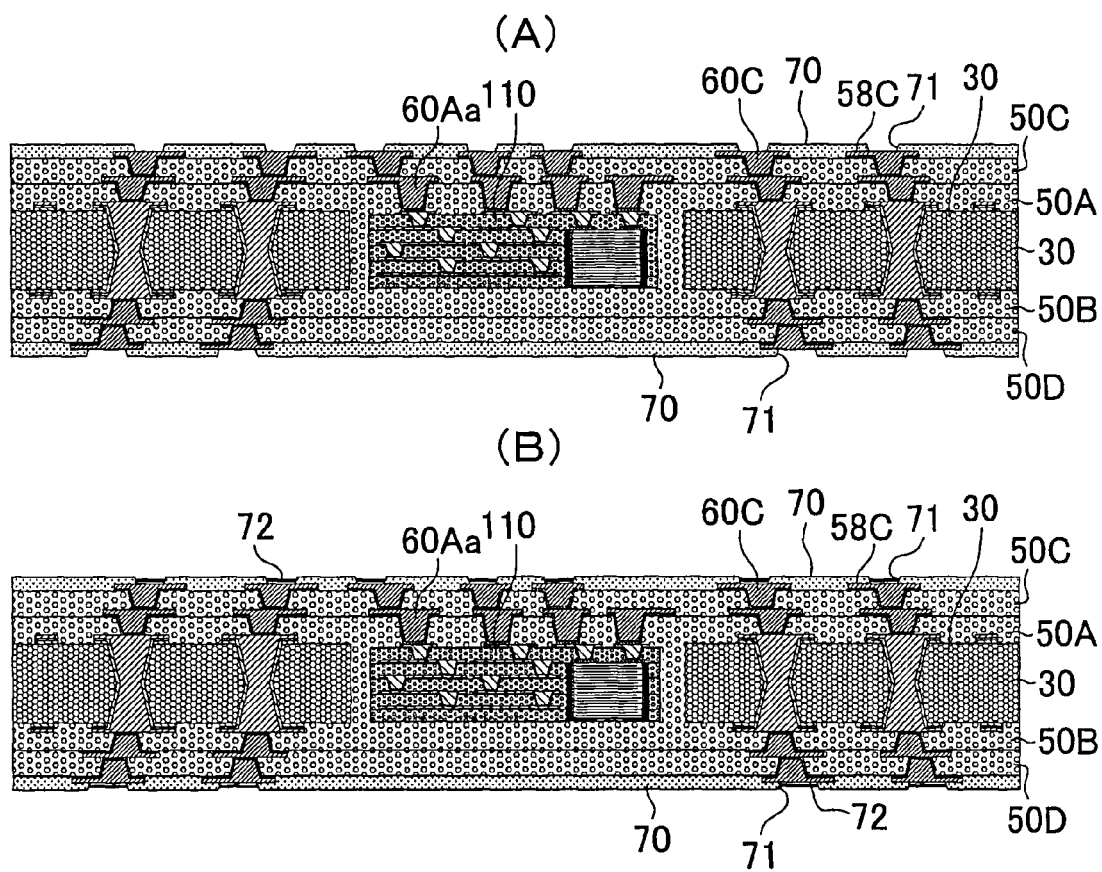
FIGS. 13(A)-13(B) are process views illustrating the method for manufacturing the printed circuit board of the first embodiment.

Each of the coil layers (158A, 158B, 158C, 158D) is formed of a line pattern. FIG. 3 illustrates an example of such patterns. Each coil layer is formed on one plane. The first to fourth coil layers (158A, 158B, 158C, 158D) are formed of ring-shaped conductor circuits, respectively. Each coil layer is formed of a conductor circuit substantially having a form of one turn. Thereby, a coil of four turns is formed. The respective coil layers flow the current in the same direction. Arrows in the drawings indicate the current directions, respectively. In this example, the direction is counterclockwise. It is preferable that the directions of the currents in the respective coil layers overlap one another in a sectional direction.

The first laminated coil (110IA) will be discussed below.

The via conductor (160E) is connected to a via pad (P4) of the uppermost coil layer (fourth coil layer) (158D). The uppermost coil layer is connected to the connection via conductor (60Aa) of the upper buildup layer via the electrode (158ED). The fourth coil layer has a connector (V4) located at an end opposite the via pad (P4) and connected to the via conductor (160D) formed in the fourth resin insulation layer.

The fourth coil layer is connected to the third coil layer (158C) through the via conductor (160D). The third coil layer has a via pad (P3) for connection to the via conductor (160D). The via pad (P3) is formed at an end of the third coil layer. The third coil layer has a connector (V3) located at an end opposite the via pad (P3) and connected to the via conductor (160C) formed in the third resin insulation layer.

The third coil layer is connected to the second coil layer (158B) through the via conductor (160C). The second coil layer has a via pad (P2) for connection to the via conductor (160C). The via pad (P2) is formed at an end of the second coil layer. The second coil layer is provided at an end opposite the via pad (P2) with a connector (V2) connected to the via conductor (160B) formed in the second resin insulation layer. The second coil layer is connected to the first coil layer (158A) through the via conductor (160B). The first coil layer has a via pad (P1) for connection to the via conductor (160B). The via pad (P1) is formed at an end of the first coil layer. An end of the first coil layer opposite the via pad (P1) is connected to a connection line (L10). The connection line (L10) is connected to the second laminated coil. The second laminated coil is substantially the same as the first laminated coil, and the currents flow in the same direction through the first and second laminated coils, respectively. In this case, an electrode of the first laminated coil is an input electrode (158EDI), and an electrode of the second laminated coil is an output electrode (158EDO).

FIG. 14 illustrates another example of a laminated coil. This drawing illustrates only the uppermost and lowermost coil layers. In this example, each coil layer is formed of a conductor circuit (line pattern) of a spiral from. An uppermost coil layer (658A) has a via pad (658Aa) and a connector (658Ab) the same as the laminated coil illustrated in FIG. 3. The via pad (658Aa) is connected to a conductive layer in the printed circuit board through a via conductor on the via pad (658Aa). In the coil in FIG. 14, a via pad (658P) of a lowermost coil layer (658B) is formed at a center of the lowermost coil layer, which is connected at its outer periphery to a connection line (L658). When the number of the coil layers is even, the via pad (658Aa) of the uppermost coil layer is formed at the outer periphery of the uppermost coil layer (FIG. 14A). When the number of the coil layers is odd, the via pad (658Aa) of the uppermost coil layer is formed at the center of the coil layer (658A), and the via pad (658P) of the lowermost coil layer is formed at the center of the lowermost coil layer (FIG. 14B).

Figure 15:
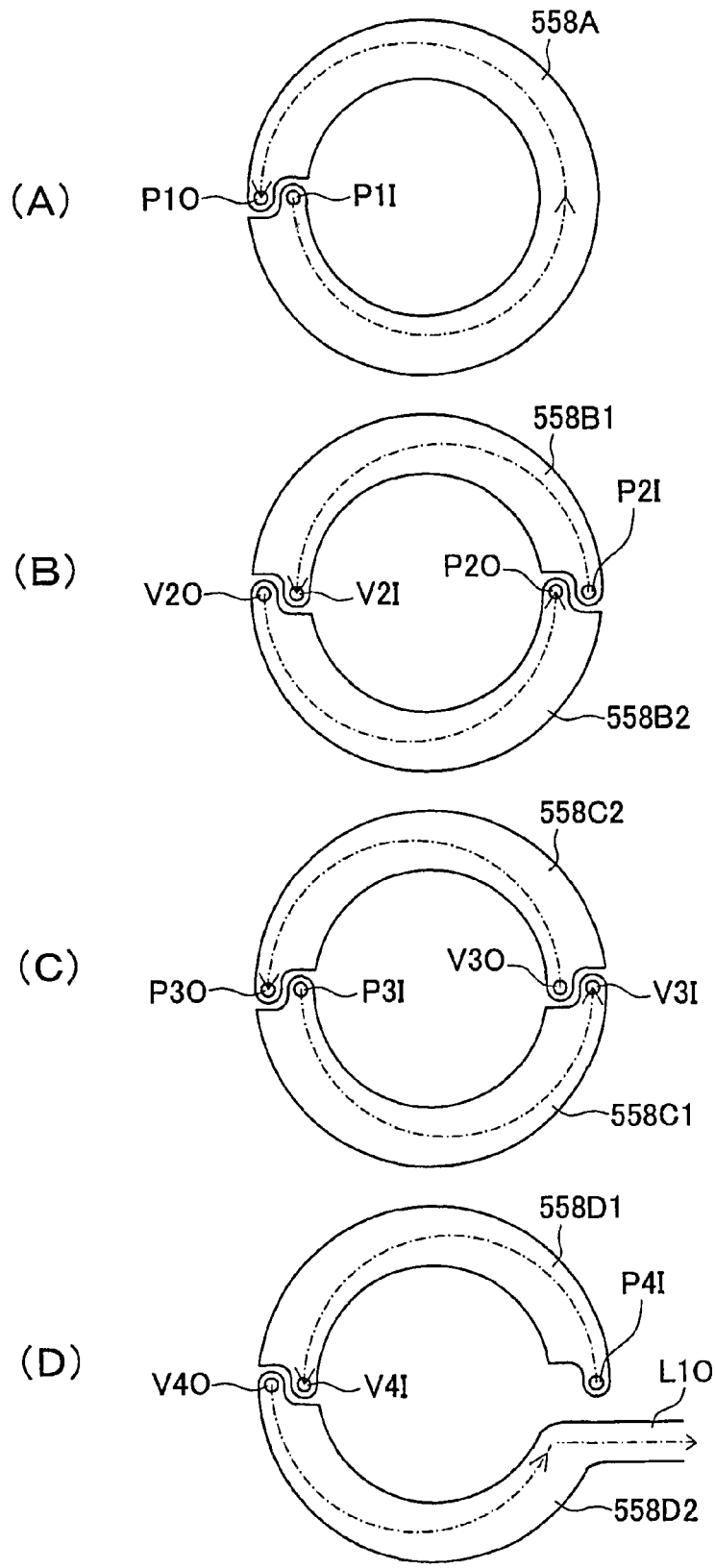
FIGS. 15(A)-15(D) are plan views illustrating respective coil layers of a laminated coil according to another example.

FIG. 15 illustrates another example of a laminated coil.

The connection via conductor (60Aa) illustrated in FIG. 1 is connected to an input via pad (P4I) of a fourth coil layer (uppermost coil layer) (558D1) via an input electrode of an inductor. The current flows counterclockwise to make substantially half a circle, and reaches an input connector (V4I) of the fourth coil layer (558D1) (FIG. 15D). The fourth coil layer (558D1) is connected to an input via pad (P3I) of a third coil layer (558C1) through the via conductor (160D). The current flows counterclockwise to make substantially half a circle, and reaches an input connector (V3I) of the third coil layer (558C1) (FIG. 15C). The third coil layer (558C1) is connected to an input via pad (P2I) of a second coil layer (558B1) through the via conductor (160C) (FIG. 15B). The current flows counterclockwise to make substantially half a circle, and reaches an input connector (V2I) of the second coil layer (558B1) (FIG. 15B). The second coil layer (558B1) is connected to an input via pad (P1I) of a first coil layer (558A) through the via conductor (160B) (FIG. 15A). The current flows counterclockwise to make substantially a circle through the first coil layer (558A), and is connected to an output connector (V2O) of a second coil layer (558B2) through the via conductor (160B) from an output via pad (P1O) of the first coil layer (558A). The current flows counterclockwise to make substantially half a circle, and reaches an output via pad (P2O) of the second coil layer (558B2) (FIG. 15B). The second coil layer is connected to an output connector (V3O) of a third coil layer (558C2) through the via conductor (160C) (FIG. 15C). The current flows counterclockwise to make substantially half a circle, and reaches an output via pad (P3O) of the third coil layer (558C2) (FIG. 15C). The third coil layer is connected to an output connector (V4O) of a fourth coil layer (558D2) through the via conductor (160D) (FIG. 15D). The current flows counterclockwise to make substantially half a circle, and reaches the connection line (L10) (FIG. 15D). The laminated coil illustrated in FIG. 15 is connected to another laminated coil in series or in parallel through a connection line. Each of the input and output circuits is formed of a line pattern of half a circle (FIG. 15). Preferably, each of the layered coil layers is connected in parallel to the others. Each inductor has an input electrode, and an output electrode of each inductor is connected to a common electrode. The common electrode is connected to the connection via conductor of the printed circuit board.

The electronic components illustrated in FIGS. 2, 17, 20, 23, 24, 25 and 26 have the electrodes (158ED). Therefore, when the electronic component is arranged inside the core substrate of the printed circuit board, an opening for the connection via conductor can be formed on the electrode. The connection reliability between the electrode of the electronic component and the connection via conductor is high.

The inductor (110I) of the electronic component is formed of the alternately laminated resin insulation layers and coil layers, and has the electrode for connection to the connection via conductor of the printed circuit board. Therefore, the thickness of the electronic component is adjusted by adjusting the numbers of the resin insulation layers and the coil layers. Accordingly, the electronic component is manufactured with consideration given to the thickness of the core substrate. The inductance value is adjusted by the numbers of the coil layers and the layered inductors. Accordingly, the electronic component of the embodiment of the invention is suitable for the electronic component to be arranged inside the core substrate. Since the connection via conductor connects the printed circuit board to the electronic component, the electronic component of the embodiment is suitable for the component to be arranged inside the printed circuit board. The electronic component may be covered with a non-magnetic resin film. Deterioration of the electronic component is suppressed.

Since the buildup layer and the electronic component are manufactured independently of each other, the thickness of the line pattern of the coil layer can be greater than that of the conductive layer of the buildup layer. Therefore, the electronic component of a low resistance value is arranged inside the printed circuit board. The printed circuit board having a fine conductor circuit is manufactured.

The inductor of the electronic component in each of the embodiments and modifications has the input and output electrodes, and a power supply line in the printed circuit board is connected in series to the inductor of the electronic component. For example, the power enters the inductor from the power supply line in the printed circuit board through the input electrode of the inductor. This power passes through the inductor, and is output from the output electrode of the inductor to the power supply line in the printed circuit board. The power reaches an IC chip mounted on the printed circuit board through a pad (pad for the power supply) formed on the printed circuit board. The IC chip is mounted on the printed circuit board through pads including the power supply pad. The pads include a signal pad, a ground pad, and the power supply pad. A power supply line from the output electrode of the inductor to the pad for mounting the IC chip of the printed circuit board is referred to as a power transmission circuit. The passive component such as a capacitor in the electronic component is connected in parallel to the power transmission circuit. The passive component such as a capacitor in the electronic component is grounded. In each of the embodiments and modifications, the electronic component and circuit in the printed circuit board are connected similarly to the first embodiment. In each of the embodiments and the modifications, the electronic component is grounded in a similar manner.

In the embodiment, the inductor and the passive component such as a capacitor are integrated to form the electronic component including the inductor and a passive accessory such as a capacitor. Therefore, in the electronic component of the embodiment, the inductor and the passive component can be connected by a short line. The distance between the inductor and the passive component is preferably 500 μm or less. Since a parasitic capacitance decreases, noises of the power transmission circuit decrease. A stable power can be supplied to the IC chip. Malfunction of the IC ship is suppressed.

FIG. 17A illustrates Example 1 of an electronic component. In Example 1, the electronic component has via conductors (via conductors for a capacitor) (160EP) and (160EE) connected to the electrodes of a capacitor in the electronic component. The via conductor (160EP) is connected to a power supply electrode (108P) of the capacitor. The via conductor (160EE) is connected to a ground electrode (108E) of the capacitor. In Example 1, the inductor and the capacitor are not connected to each other inside the electronic component. When the electronic component of Example 1 is built into the printed circuit board, the inductor and the capacitor are connected by connection via conductors in the printed circuit board and a connection circuit (80A) on an upper interlayer resin insulation layer. FIG. 17B illustrates an example. The electrodes of the capacitor and the connection via conductors are connected through the via conductors (160EP, 160EE), respectively. The output electrode of the inductor and the power supply electrode of the chip capacitor are connected by the connection via conductors and the connection circuit (80A).

Figure 23:
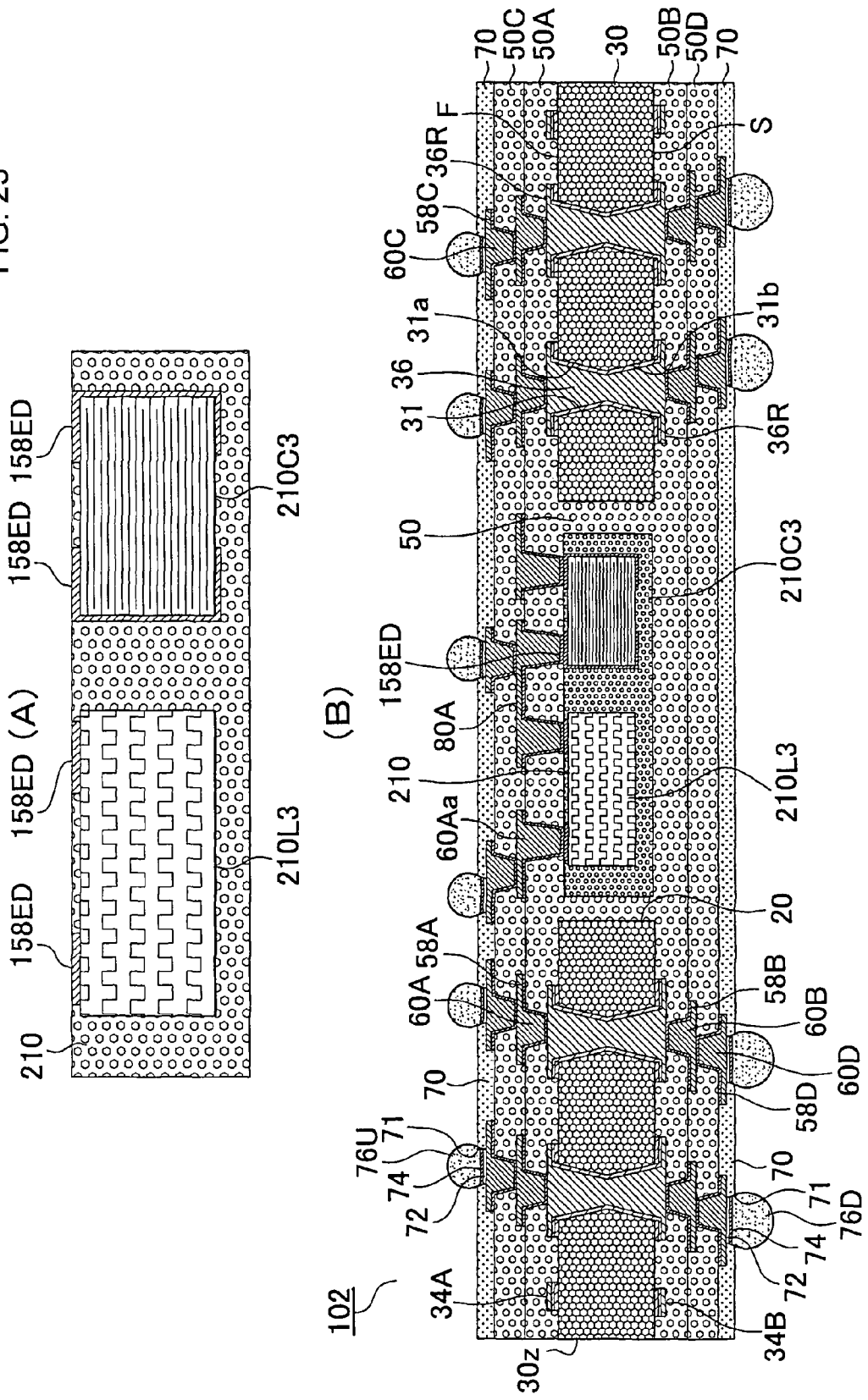
FIGS. 23(A)-23(B) are cross-sectional views of Example 2 of an electronic component and a printed circuit board with the built-in electronic component.
Figure 24:
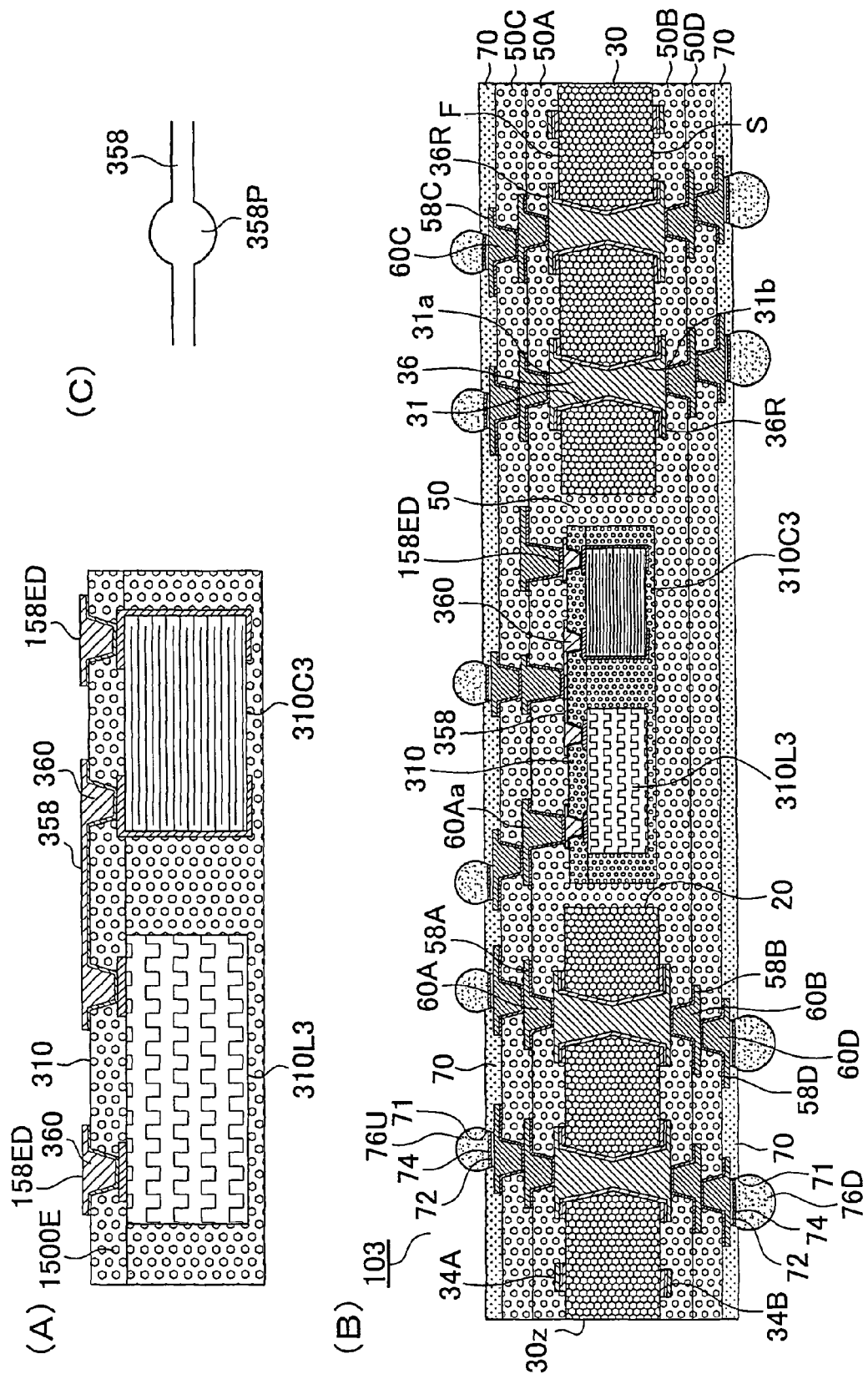
FIGS. 24(A)-24(C) are cross-sectional views of Example 3 of an electronic component and a printed circuit board with the built-in electronic component.
Figure 25:
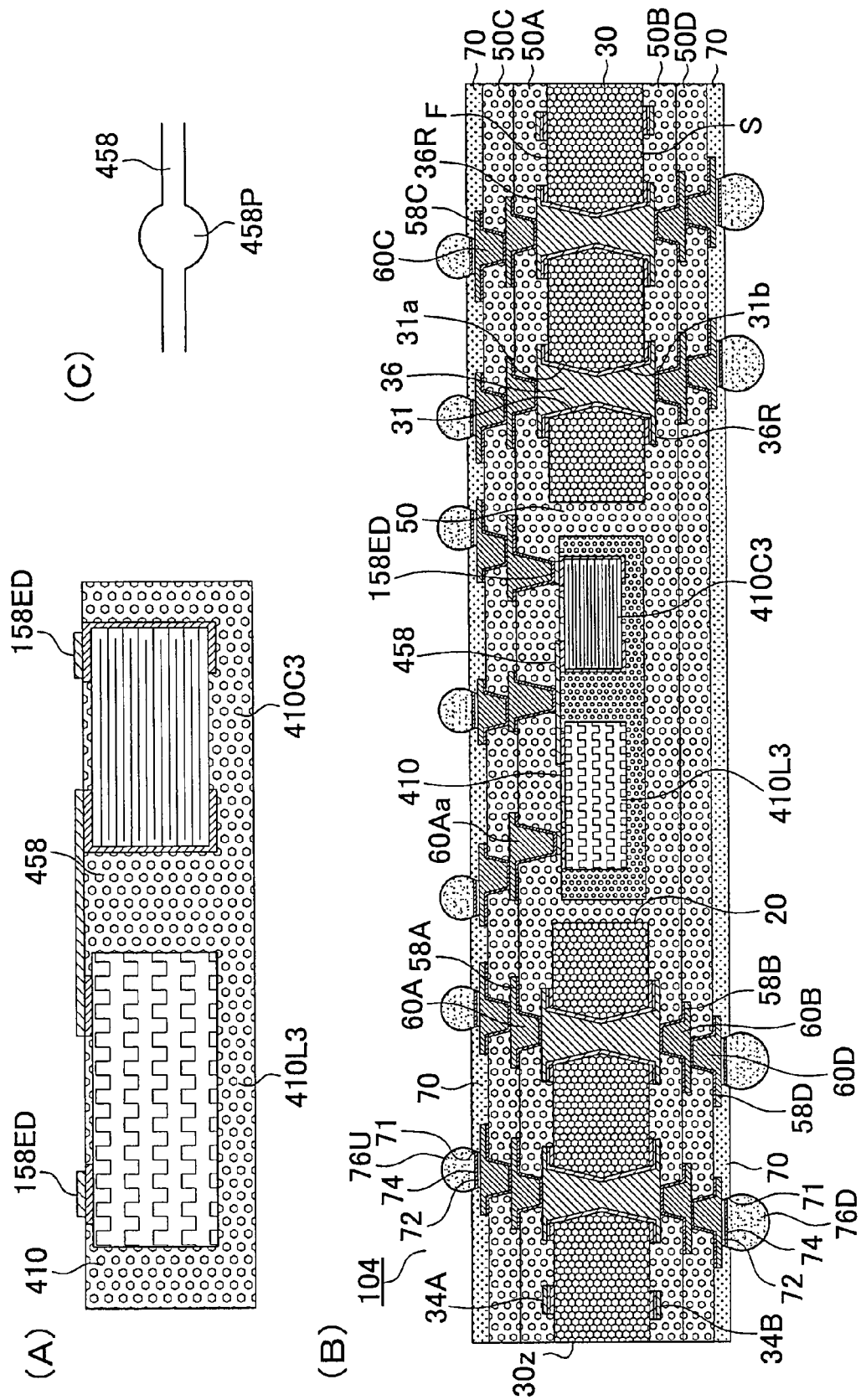
FIGS. 25(A)-25(C) are cross-sectional views of Example 4 of an electronic component and a printed circuit board with the built-in electronic component.

FIG. 23A illustrates an electronic component 210 of Example 2. An inductor (210L3) in FIG. 23A is illustrated in a simplified manner. The inductor (210L3) in FIG. 23A is substantially the same as the inductor illustrated in FIGS. 3, 14 and 15. FIG. 23B illustrates a printed circuit board that accommodates the electronic component illustrated in FIG. 23A. The electronic component illustrated in FIG. 23 does not have a connection via conductor for a capacitor. The electrode of the capacitor of the electronic component is directly connected to via conductor of the printed circuit board. The inductor (210L3) and a capacitor (210C3) are connected by the connection via conductors in the printed circuit board and the connection circuit (80A) on the upper interlayer resin insulation layer. This reduces the length of line between an inductor and a passive component such as a capacitor.

FIG. 24A illustrates an electronic component 310 of Example 3. Similarly to Example 2, an inductor of Example 3 is illustrated in a simplified manner. In an electronic component illustrated in FIG. 24A, an inductor (310L3) and passive components such as a capacitor (310C3) are connected via conductors 360 and a line (connection line) 358 in the electronic component. FIG. 24B illustrates a printed circuit board with a built-in electronic component illustrated in FIG. 24A. In this example, since the inductor (310L3) and the capacitor (310C3) are connected in the electronic component 310, the length of the line between them is short. Also, connection reliability between them is high. In Example 3, failure/no-failure of the electronic component can be determined before the electronic component is arranged inside the printed circuit board. The connection reliability of the printed circuit board is improved. The connection line 358 may have a via pad (358P) illustrated in FIG. 24C. A connection via conductor is formed in the via pad (358P).

FIG. 25A illustrates an electronic component 410 of Example 4. Similar to Example 2, an inductor of Example 4 is illustrated in a simplified manner. In the electronic component illustrated in FIG. 25A, an inductor (410L3) and a passive component such as a capacitor (410C3) are connected by a line (connection line) 458 in the electronic component. In this example, the electrode of the capacitor and the electrode of the inductor are connected by the line 458 without a via conductor interposed therebetween. FIG. 25B illustrates a printed circuit board that accommodates the electronic component illustrated in FIG. 25A. In this example, since the inductor (410L3) and the capacitor (410C3) in the electronic component 410 are connected only by the line 458, the length of the line between them is short. The connection reliability between them is improved. In Example 4, failure/no-failure of the electronic component can be determined before the electronic component is arranged inside the printed circuit board. The connection reliability of the printed circuit board is improved. The connection line 458 may have a via pad (458P) illustrated in FIG. 25C. A connection via conductor is formed on the via pad (485P).

FIG. 26A is an enlarged view of an inductor 1110 of an electronic component according to Example 5. The electronic component of Example 5 is substantially the same as one of those of Examples 1, 2, 3, 4, 6 and 7, and may have substantially the same via conductor, capacitor and connection line as it.

Figure 26:
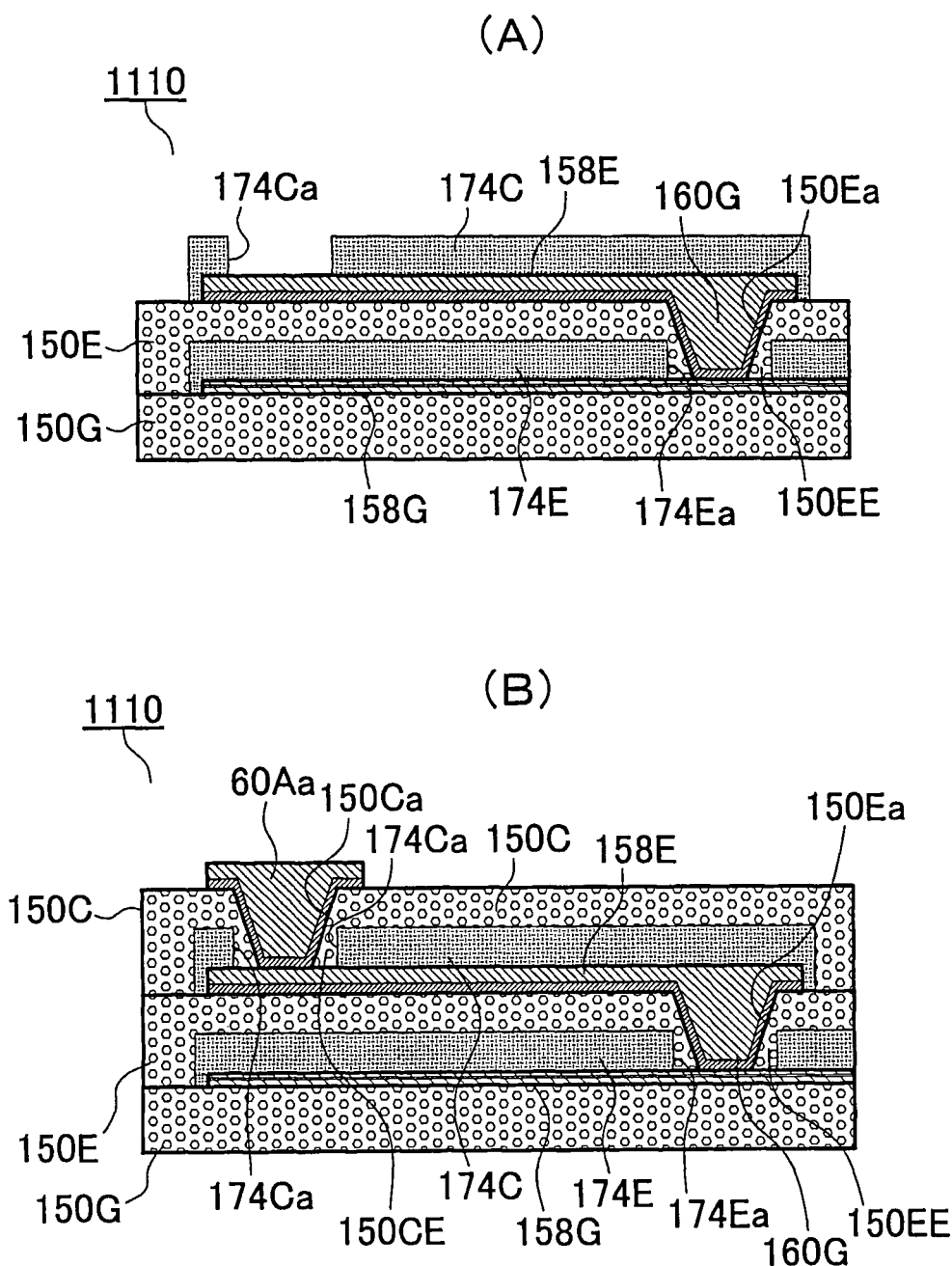
FIGS. 26(A)-26(B) show inductor of an electronic component of Example 5.

FIG. 26 illustrates one laminated coil. A capacitor and the like are not illustrated in FIG. 26.

The inductor 110 of Example 5 has a lowermost resin insulation layer (support layer) (150G), a lowermost coil layer (158G) formed on the resin insulation layer (150G), a magnetic layer (174E) formed on the coil layer (158G), a second resin insulation layer (150E) covering the magnetic layer (174E), an uppermost coil layer (158E) formed on the second resin insulation layer (150E), a via conductor (160G) formed in a via-conductor opening (150Ea) that is formed in the second resin insulation layer (150E), and a magnetic layer (174C) formed on the uppermost coil layer. The magnetic layer(s) may be replaced with a magnetic film(s). The magnetic layers (174E, 174C) contain resin and magnetic particles. The content of the magnetic particles is 30 vol. % to 60 vol. %.

The resin contained in the resin insulation layers (150G, 150E) is preferably made of the same material as the resin contained in the magnetic layer (174E). This improves adhesion between the magnetic layer and the resin insulation layer.

The magnetic layers (174E, 174C) have openings (174Ea, 174Ca), respectively. The opening (174Ea) is filled with resin (150EE). In Example 5, the resin (150EE) is a part of the second resin insulation layer (150E). Specifically, the second resin insulation layer (150E) has a portion entering the opening (174Ea). In Example 5, an opening in the magnetic layer formed on the uppermost coil layer partially exposes the uppermost coil layer.

A circuit of an inductor illustrated in FIG. 26A is substantially the same as the circuits of the inductors illustrated in FIGS. 3, 14 and 15. Therefore, the inductor illustrated in FIG. 26A has input and output electrodes. In FIG. 26A, each of the input and output electrodes is a part of the uppermost coil layer. The input and output electrodes may be the upper surfaces of the via conductors illustrated in FIG. 24 and others. In this case, the magnetic layer exposes the upper surface of the via conductor. Partial exposure is preferable.

The magnetic layer (174C) has an opening (174Ca), through which the input or output electrode is exposed. Further, the electronic component may have the third resin insulation layer (150C) on the magnetic layer (174C), the second resin insulation layer (150E), and the uppermost coil layer (FIG. 26B). In this case, the connection via conductor (60Aa) is formed in the opening (174Ca) of the magnetic layer (174C) as illustrated in FIG. 26B. An opening (150Ca) for the connection via conductor is formed in the third resin insulation layer without penetrating through the magnetic layer. An electronic component other than those illustrated in FIG. 26 may have the inductor illustrated in FIG. 26A or 26B. The connection via conductor (60Aa) in FIG. 26B corresponds to the via conductors in the electronic components illustrated in FIGS. 17 and 24. As illustrated in FIG. 26A, the magnetic layer having the opening for the via conductor covers the side wall of the coil layer and the upper surface of the coil layer. The magnetic layer has an opening for the via conductor. The via conductor is formed in the opening (174Ea). The opening for the via conductor is formed in the resin filling the opening in the magnetic layer. The inductor illustrated in FIG. 26 may be used as the inductors of the electronic components illustrated in FIG. 2, Examples 1, 2, 3, 4, 6 and 7.

In the inductor in FIG. 26, the magnetic layer made of resin containing magnetic particles is formed between the coil layers in different layers. The magnetic layer is formed on the coil layer. The magnetic permeability increases. Thereby, a thin inductor having a small number of layers can provide a desired inductance. Therefore, even when an electronic component containing the inductor is built into the core substrate, the printed circuit board is formed to be thin.

The via conductor illustrated in FIG. 26 penetrates through the resin filled in the opening in the magnetic layer and the resin insulation layer on the filled resin. The side surface of the via conductor connecting the coil layers of the different layers is not in contact with the magnetic layer. The adhesive strength between the via conductor and the magnetic layer as well as the adhesive strength between the coil layer and the magnetic layer are low. In the inductor in FIG. 26, therefore, the coil layer and the via conductor are formed on the resin insulation layer. The connection reliability between the different coil layers is improved. The opening for the via conductor can be easily formed in the resin insulation layer by laser. The resin insulation layer of the electronic component illustrated in FIG. 26 does not contain the magnetic particles. The resin insulation layer of the electronic component illustrated in FIG. 26 contains inorganic particles of silica or the like other than the magnetic particles. The electronic component described in FIG. 2 and in Examples 1, 2, 3, 4, 5, 6, and 7 may each be accommodated in the opening of the core substrate of the printed wiring board according to each embodiment and each modification.

FIGS. 4 to 8 illustrate manufacturing steps of the electronic component of the first embodiment.

Preparation of Film for Resin Insulation Layer Containing Magnetic Particles (A) Preparation of Resin-Containing Solution Eighty-five grams of epoxy resin (manufactured by Japan Epoxy Resin Co., Ltd., brand name: "Epikote 1007" and the like) and magnetic particles, for instance, of iron oxide (III) are added to a mixture solvent of 6.8 g of MEK and 27.2 g of xylene. Chromic iron oxide (ferrichrome), cobalt iron oxide, barium ferrite and the like are examples of such magnetic particles.

(B) Preparation of Film for Resin Insulation Layer

As a curing agent, dicyandiamide (manufactured by PTI JAPAN Corp., brand name: "CG-1200" and others) and a curing catalyst (manufactured by Shikoku Chemicals Corporation, brand name: "Curezol 2E4 HZ" and others) are added to the resin-containing solution of the above (A). Thereafter, the mixture is kneaded by three rollers to form a solution for a resin insulation layer. An additional amount of each of the curing agent and the curing catalyst is 3.3 g per 100 g of epoxy.

The solution for the resin insulation layer is applied by a roll coater (manufactured by Cermatronics Boeki Co., Ltd.) onto a sheet of polyethylene terephthalate or the like. The solution is dried at 160° C. for 5 minutes to remove the solvent. A film for the resin insulation layer containing the magnetic particles is obtained. Its approximate thickness is 20 μm to 50 μm.

The amount of the magnetic particles in the film for the resin insulation layer is 30 vol. % to 60 vol. %. The film for the resin insulation layer may contain inorganic particles of silica alumina or the like without containing the magnetic particles. The film for the resin insulation layer containing the magnetic particles may be used as a film for forming a magnetic layer.

A method for manufacturing an electronic component having two laminated coils is described below.

A plating resist is formed on a support plate 170 such as a copper plate. Using the support plate as an electrode, a stopper layer (1000A) is formed on the support plate exposed through the plating resist. The stopper layer is made of nickel or the like different from the material of the support plate.

Subsequently, copper electroplating or the like using the support plate 170 as the electrode is conducted to form, on the stopper layer, two uppermost coil layers (1000D1, 1000D2), an input electrode (1000C) of each layered coil layer, a common electrode (output electrode) (1000D), and a connection line (1000E). The connection line connects the laminated coil to the common electrode. The plating resist is removed (FIG. 4A). The uppermost coil layer and the like are made of an electroplated film (100Z).

The film of the above (B) is layered on the support plate, the uppermost coil layer, the input electrode, the common electrode, and the connection line. Thereafter, the film is cured to form an uppermost resin insulation layer (1500D) (FIG. 4B). The resin insulation layer of the first embodiment is made of magnetic particles and resin such as epoxy. In FIG. 4B, the virtual dotted line indicates the uppermost coil layer.

A via-conductor opening (1510D) is formed in the resin insulation layer (1500D) to reach a via pad (P1O) of the uppermost coil layer. FIG. 4B indicates the opening (1510D) by a solid circle. An electroless-plated film (1520B) is formed on the resin insulation layer (1500D) and the inner wall of the opening (1510D). A plating resist is formed on the electroless-plated film (1520B). Electrolytic plating is conducted to form an electrolytic-plated film (1560B) on the electroless-plated film (1520B) exposed through the plating resist. Thereafter, the plating resist is removed, and the electroless-plated film (1520B) between the electrolytic-plated films (1560B) is removed. Accordingly, second coil layers (1580B1, 1580B2) are formed of the electroless-plated film (1520B) and the electrolytic-plated film (1560B) on the electroless-plated film (FIG. 5A).

The film of the above (B) is layered on the second coil layer and the uppermost resin insulation layer. Thereafter, the film is cured to form a second resin insulation layer (1500C).

Via-conductor openings (1510C) each reaching the via pad (P2O) of the second coil layer are formed by laser in the second resin insulation layer (1500C) (FIG. 5B). The opening (1510C) is drawn by a solid circle. The virtual line indicates the second coil layer in FIG. 5B.

An electroless-plated film (1520C) is formed on the second resin insulation layer (1500C) and in the opening (1510C) for the via conductor. A plating resist is formed on the electroless-plated film (1520C). An electrolytic-plated film (1560C) is formed by the electrolytic plating on the electroless-plated film exposed through the plating resist. The plating resist is removed, and the electroless-plated film between the electrolytic-plated films (1560C) is removed. Third coil layers (lowermost coil layers) (1580C1) and (1580C2) formed of the electroless-plated film (1520C) and the electrolytic-plated film (1560C) on the electroless-plated film as well as connectors (V3O) for connection to the via conductor are formed (FIG. 6A). Via conductors are formed in the via-conductor openings (1510C, 1510D) formed in the resin insulation layers (1500C, 1500D), respectively, and these via conductors (15100C, 15100D) make connections between the coil layers formed in different layers.

The two laminated coils (1101A, 1101B) are formed on the support plate 170. The first and second laminated coils are connected in parallel through the connection line. Currents in the respective coil layers and the respective laminated coils flow in the same direction. An intermediate component having the inductor is completed (FIG. 6A). The intermediate component having the inductor has three coil layers.

Each resin insulation layer has a larger size than the inductor. The intermediate component has the opening 112 for accommodating the chip capacitor (FIG. 7A). The opening 112 penetrates through all the resin insulation layers to reach the support plate. The opening 112 is formed by laser or a router. The chip capacitor (110C) is accommodated in the opening 112 (FIG. 7B). A distance (ZZ) between the passive component such as the chip capacitor and the inductor is preferably 0.4 mm or less (see FIG. 7B). A parasitic capacitance decreases. A size of a cavity decreases. Warping of the printed circuit board decreases. The film of the above (B) is layered on the second resin insulation layer, the lowermost coil layer, and the chip capacitor. Heat pressing is performed. The resin formed of the resin in the film and the particles such as magnetic particles and inorganic particles fill the space between the chip capacitor (110C) and the side wall of the resin insulation layer exposed by the opening 112. Thereafter, the resin filling the space and the film are cured to form the fixing resin that fills the space and a lowermost resin insulation layer (1500B) (FIG. 7C).

In this manner, since the electrode of the inductor and the electrode of the passive component are arranged on the support plate, the electrode of the inductor and the electrode of the passive component are located substantially on the same plane. The via conductor connected to the electrode of the inductor has substantially the same length as the via conductor connected to the electrode of the passive component. This increases the connection reliability between the electrode of the inductor and the via conductor connected thereto, and between the electrode of the passive component and the via conductor connected thereto.

The support plate 170 is removed by etching or the like. The uppermost coil layer, the input electrode, the common electrode (output electrode), and the stopper layer on the connection line are selectively removed. The electronic component 110 illustrated in FIGS. 8A and 23A are completed. As illustrated in FIG. 23, the upper surface of the electrode of the inductor may be flush with the upper surface of the electrode of the passive component.

A resin insulation layer (1500E) is formed on the uppermost resin insulation layer, the uppermost coil layer, and the chip capacitor of the electronic component illustrated in FIG. 8A (FIG. 8B). The resin insulation layer is formed of the film for the resin insulation layer already described in (B) above. The resin insulation layer may contain the inorganic particles of silica or the like without containing the magnetic particles. An opening (151E) reaching the electrode of the inductor and the electrode of the passive component is formed for the via conductor in the resin insulation layer (FIG. 8B). An electroless-plated film is formed on the resin insulation layer (1500E) and the inner wall of the opening for the via conductor in the resin insulation layer (1500E). Subsequently, a plating resist is formed on the electroless-plated film thus formed. An electrolytic-plated film is formed on the electroless-plated film exposed through the plating resist. The plating resist is removed. The electroless-plated film between the electrolytic-plated films is removed. The via conductors are formed on the input and output electrodes of the inductor, the power supply electrode of the chip capacitor, and the ground electrode. Simultaneously, the line (connection line) 358 connecting the output electrode of the inductor to the power supply electrode of the chip capacitor may be formed (FIG. 24A). This line has the pad (358P) illustrated in FIG. 24C. The connection via conductor of the printed circuit board is formed on this pad. The electronic component illustrated in FIG. 24A is completed. When the connection line 358 and the pad (358P) are not formed, the electronic components illustrated in FIGS. 8C and 2 are completed.

An electroless-plated film is formed on the uppermost resin insulation layer, the uppermost coil layer, and the chip capacitor of the electronic component illustrated in FIG. 8A. A plating resist is formed on the electroless-plated film thus formed. The openings in the plating resist expose the input and output electrodes of the inductor and both the electrodes of the chip capacitor. The plating resist has an opening for the line (connection line) connecting the output electrode of the inductor to the power supply electrode of the chip capacitor. The opening for the line connecting the output electrode of the inductor to the power supply electrode of the chip capacitor is formed in a position on the uppermost resin insulation layer avoiding the inductor. This prevents lowering of the inductance value. The electrolytic-plated film is formed on the electroless-plated film exposed through the plating resist. The plating resist is removed. The electroless-plated film between the electrolytic-plated films is removed. The conductors are formed on the input and output electrodes of the inductor as well as the power supply electrode and the ground electrode of the chip capacitor. Simultaneously, the line (connection line) 458 connecting the output electrode of the inductor to the power supply electrode of the chip capacitor is formed. When the inductor does not have a coil layer on the uppermost resin insulation layer, and has only the input and output electrodes, the line connecting the output electrode of the inductor to the power supply electrode of the chip capacitor may be formed in any position. The flexibility in design increases. The line 458 preferably detours around the inductor. A line (458A) has a pad (458P) illustrated in FIG. 25C. The connection via conductor of the printed circuit board is formed on this pad. The electronic component illustrated in FIG. 25A is completed. In the electronic component illustrated in FIG. 24, the output electrode of the inductor and the power supply electrode of the chip capacitor are connected through the connection line on the resin insulation layer (1500E) and the via conductor formed on the resin insulation layer (1500E).

A method for manufacturing the electronic component of Example 6 illustrated in FIG. 30E is described below.

The film of the above (B) is layered on the support plate 170, and then is cured to form the first resin insulation layer (150A) (FIG. 27A). The resin insulation layer (150A) is made of the resin such as epoxy and the magnetic particles. In the drawing, the support plate is illustrated as a single plate. A support plate formed of a copper-clad laminate and copper foil may be used as the support plate used in manufacturing the electronic component. The copper foil and copper-clad laminate are ultrasonically joined together. Electronic components may be formed on the opposite surfaces of the support plate, respectively, although not illustrated.

An electroless-plated film (152A) is formed on the resin insulation layer (150A). A plating resist is formed on the electroless-plated film (152A). By the electroplating, an electrolytic-plated film (156A) is formed on the electroless-plated film (152A) exposed through the plating resist. Thereafter, the plating resist is removed, and the electroless-plated film between the electrolytic-plated films (156A) is removed. Accordingly the lowermost coil layer (158A) is formed of the electroless-plated film (152A) and the electrolytic-plated film (156A) on the electroless-plated film (FIG. 27B).

The film in the above (B) is layered on the lowermost coil layer and the first resin insulation layer. Thereafter, the film is cured to form the second resin insulation layer (150B) (FIG. 27C).

An opening (151B) reaching the via pad (P1) of the lowermost coil layer is formed for the via conductor by laser in the second resin insulation layer (150B) (FIG. 28A). An electroless-plated film (152B) is formed on the second resin insulation layer (150B) and in the opening (151B) for the via conductor (FIG. 28B).

Figure 29:
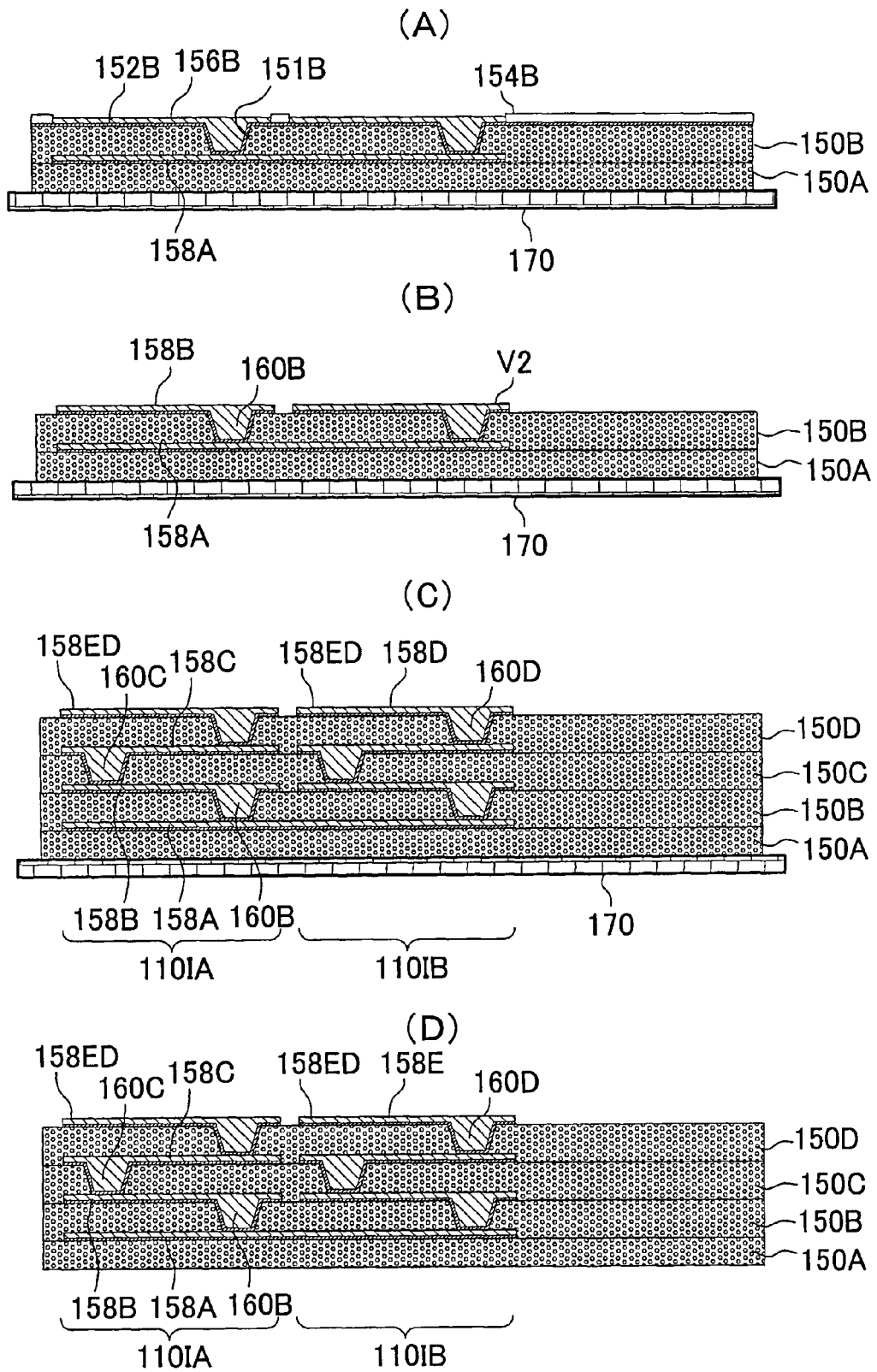
FIGS. 29(A)-29(D) are process views illustrating the method for manufacturing the electronic component of Example 6.

A plating resist (154B) is formed on the electroless-plated film (152B) (FIG. 28C). An electrolytic-plated film (156B) is formed by electrolytic plating on the electroless-plated film exposed through the plating resist (FIG. 29A). The plating resist is removed, and the electroless-plated film between the electrolytic-plated films (156B) is removed. Accordingly, the second coil layer (158B), the via conductor (160B) and the connector (V2) are formed of the electroless-plated film (152B) and the electrolytic-plated film (156B) on the electroless-plated film (FIG. 29B). The via conductor (160B) connects the via pad of the lowermost coil layer to the connector of the second coil layer. The surface of the second coil layer is roughened (not illustrated).

In methods similar to the methods of forming the second resin insulation layer and the second coil layer, the second resin insulation layer is formed, and the third resin insulation layer (150C), the third coil layer (158C), the fourth resin insulation layer (150D), and the fourth coil layer (uppermost coil layer) (158D) are successively formed on the second coil layer. The uppermost coil layer has an input electrode (158EA) and an output electrode (158ED) (FIG. 29C). The two laminated members (1101A, 1101B) are formed on the support plate 170 (FIG. 29C). FIG. 29C illustrates the two laminated coils (first and second laminated coils (1101A, 1101B)) on one of the surfaces of the support plate. In the respective layered coil layers and the respective coil layers, the currents flow in the same direction. The via conductor (160C) in the third resin insulation layer connects the second and third coil layers, and the via conductor (160D) in the fourth resin insulation layer connects the third and fourth coil layers. The support plate is removed. The intermediate component having the inductor is completed (FIG. 29D).

Figure 30:
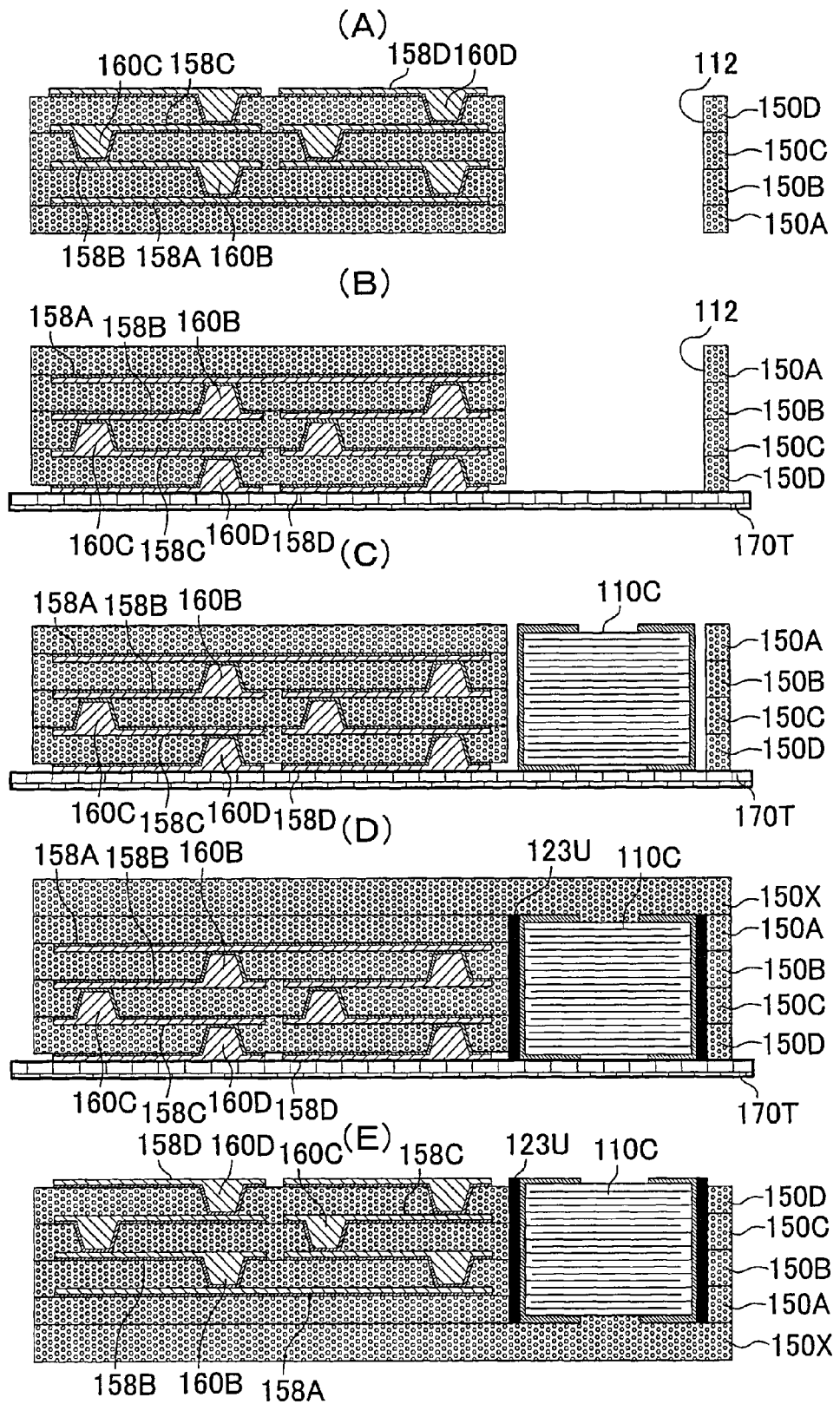
FIGS. 30(A)-30(E) are process views illustrating the method for manufacturing the electronic component of Example 6.

Each resin insulation layer has a larger size than the inductor. The opening 112 for accommodating the chip capacitor is formed in the intermediate component (FIG. 30A). The opening 112 penetrates through all the resin insulation layers. The opening 112 is formed by laser or a router. A tape (170T) is adhered to the fourth resin insulation layer and the uppermost coil layer. The opening 112 is covered by the tape. The chip capacitor (110C) is accommodated in the opening 112. The electronic component such as the chip capacitor is mounted on the tape (FIG. 30C). The film of the above (B) is layered on the first resin insulation layer (150A) and the chip capacitor. Heat pressing is performed. The resin, the magnetic particles and the inorganic particles in the film fill the space between the chip capacitor (110C) and the side wall of the resin insulation layer exposed through the opening 112. The resin and the film are cured to form a fixing resin (123U) filling the space and a lowermost resin insulation layer (150x) (FIG. 30D). The tape is removed (FIG. 30E). The electronic component of Example 6 is completed. In substantially the same method as the other method, the electronic component of Example 6 is built into the printed circuit board, completing the electronic component in which the input and output electrodes of the inductor as well as the power supply electrode and the ground electrode of the chip capacitor are exposed. Subsequently, an uppermost resin insulation layer (150Z) is formed on the fourth resin insulation layer, the inductor, and the chip capacitor (FIG. 31A). In this method, since the support plate is removed, and the passive component is formed in the electronic component, the tape is formed on the inductor and the resin insulation layer. The opening 112 is covered by the tape. The tape may be adhered to either surface. The tape may be adhered to the first resin insulation layer. The resin insulation layer (150Z) is formed on the fourth resin insulation layer and the uppermost coil layer of the electronic component of Example 6. The via conductors penetrating the resin insulation layer (150Z) are formed on the input and output electrodes of the inductor and the opposite electrodes of the capacitor. The electronic component (FIG. 31B) of Example 7 is completed. At this time, a line (connection line) electrically connecting the output electrode of the inductor to the power supply electrode of the chip capacitor may be formed on the resin insulation layer (150Z). In the method illustrated in FIGS. 27 to 30, when the chip capacitor and the inductor have different thicknesses, respectively, the input and output electrodes of the inductor and the opposite electrodes (power supply electrode and ground electrode) of the chip capacitor can be substantially flush with each other. The connection reliability between the connection via conductor and the electronic component of the printed circuit board is improved.

FIGS. 9 to 13 illustrate the method for manufacturing the printed circuit board 10 of the first embodiment.

(1) A starting material is a double-sided copper-clad laminate (30Z) having the insulation substrate (30z) and copper foil 32 layered on the opposite sides thereof. The insulation substrate has a thickness of 50 μm to 250 μm. If a thickness is smaller than 50 μm, the substrate strength is too low. A thickness exceeding 250 μm increases the thickness of the printed circuit board. The insulation substrate has the first surface (F) and the second surface (S) opposite the first surface. Blackening processing (not illustrated) is conducted on the surface of the copper foil 32 (FIG. 9A). A CTE (coefficient of thermal expansion) in the (X-Y) direction (parallel to the first surface (F)) of the insulation substrate (30z) is smaller than that of the electronic component.

(2) The double-sided copper-clad laminate (30Z) is irradiated with laser emitted toward the first surface (F) of the insulation substrate. The first opening (31a) narrowing from the first surface of the insulation substrate toward the second surface is formed (FIG. 9B).

(3) The two-sided copper-clad laminated board (30Z) is irradiated with laser emitted toward the second surface (S) of the insulation substrate. The second opening (31b) converging from the second surface of the insulation substrate toward the first surface is formed (FIG. 9C). The second opening (31b) is connected with the first opening (31a) in the insulation substrate to form the through hole 31 for the through-hole conductor.

(4) Electroless plating is performed to form an electroless-plated film 33 on the inner wall of the through hole and on the copper foil (FIG. 9D).

(5) Electrolytic plating is performed to form an electrolytic-plated film 37 on the electroless-plated film. The through-hole conductor 36 is formed in the through hole. The through-hole conductor 36 is formed of the electroless-plated film 33 formed on the inner wall of the through hole and the electrolytic-plated film 37 filling the through hole (FIG. 9E).

(6) An etching resist 35 is formed on the electrolytic-plated film 37 at the surface of the core substrate 30 (FIG. 9F).

(7) The electrolytic-plated film 37, the electroless-plated film 33 and the copper foil 32 exposed through the etching resist are removed. Thereafter, the etching resist is removed to form the conductive layers (34A, 34B), and the through-hole conductor 36 (FIG. 10A).

(8) The opening 20 for accommodating the electronic component is formed by laser in a central portion of the insulation substrate (30z) to complete the core substrate (FIG. 10B). The core substrate has a thickness (CT) (FIG. 10B) of 60 μM to 300 μm.

(9) A tape 94 is adhered to the first surface of the core substrate, and closes the opening 20 (FIG. 10C). An example of the tape 94 is PET film.

(10) The electronic component 110 is placed on the tape 94 exposed through the opening 20 (FIG. 10D). The electronic component accommodated in the opening 20 is one of the electronic components described in the embodiments and the modifications. The electronic component is accommodated in the opening 20 formed in the insulation substrate. At this time, the electrode of the passive component such as the inductor or the chip capacitor faces the tape. The thickness of the electronic component accommodated in the opening 20 of the core substrate is 30% to 100% of the thickness of the core substrate.

(11) A B-stage prepreg is layered on the second surface (S) of the core substrate 30. Heat pressing causes the resin to seep from the prepreg into the opening, and filling resin 50 fills the opening 20 (FIG. 10E). The filling resin fills the space between the inner wall of the opening and the electronic component. The electronic component is fixed to the core substrate. Instead of the prepreg, the resin film for the interlayer resin insulation layer may be layered. The prepreg has a reinforcing material such as glass cloth, but the resin film for the interlayer resin insulation layer does not have a reinforcing material. Preferably, both of them contain the inorganic particles such as silica particles. The filling resin contains the inorganic particles of silica or the like

(12) After peeling off the tape (FIG. 11A), the B-stage prepreg is layered on the first surface (F) of the core substrate 30. The prepreg on the first and second surfaces of the core substrate is cured. The insulation layers (interlayer resin insulation layers) (50A) and (50B) are formed on the first and second surfaces of the core substrate, respectively (FIG. 11B).

(13) From the first surface side, an opening (51Aa) for the connection via conductor reaching the electrode of the electronic component is formed in the insulation layer (50A) by $CO_2$ gas laser.

Depending on an electronic component to be built in, the opening (51Aa) for the connection via conductor is formed on the pad or the via conductor of the electronic component.

When the built-in electronic component is the one illustrated in FIG. 23A, the opening (51Aa) for the connection via conductor reaches the electrode of the electronic component (the input electrode of the inductor, the output electrode of the inductor, or both the electrodes of the capacitor).

When the built-in electronic component is the one illustrated in FIG. 24A, the opening (51Aa) for the connection via conductor reaches the via conductor or the pad of the electronic component.

When the built-in electronic component is the one illustrated in FIG. 25A, the opening (51Aa) for the connection via conductor reaches the conductor or the pad on the electrode of the electronic component.

When the electronic component illustrated in FIG. 8C, 23A, 24A or 25A is placed on the tape, it is placed on the tape with its electrode of the electronic component facing the tape. Therefore, the opening for the connection via conductor connected to the inductor has a depth substantially equal to the opening for the connection via conductor connected to the passive component. The connection reliability between the connection via conductor and the electronic component increases.

Simultaneously, an opening (51A) for the via conductor reaching the conductive layer (34A) or the through-hole conductor 36 is formed. An opening (51B) for the via conductor reaching the conductive layer (34B) or the through-hole conductor 36 is formed in the insulation layer (50B) from the second surface side (see FIG. 11C). Roughened surfaces (not illustrated) are formed at the insulation layers (50A, 50B), respectively. The insulation layer (50B) may be provided with an opening for the connection via conductor reaching the electronic component.

(14) An electroless-plated film 52 is formed by electroless plating on the inner wall of the opening for the via conductor and the insulation layer (FIG. 11D).

(15) A plating resist 54 is formed on the electroless-plated film 52 (FIG. 12A).

(16) Then, an electrolytic-plated film 56 is formed by electrolytic plating on the electroless-plated film exposed through the plating resist (see FIG. 12B).

(17) Subsequently, the plating resist 54 is removed with 5% NaOH. Thereafter, the electroless-plated copper film 52 exposed through the electrolytic-plated copper film is removed by the etching to form the conductive layers (58A, 58B) made of the electroless-plated film 52 and the electrolytic-plated film 56. The conductive layers (58A, 58B) include multiple conductive circuits and lands of the via conductors. Simultaneously, the via conductors (60A, 60B) as well as the connection via conductor (60Aa) are formed (FIG. 12C). The via conductors (60A, 60B) connect the conductive layers and the through-hole conductors in the core substrate to the conductive layers (58A, 58B) on the interlayer resin insulation layer. The connection via conductor (60Aa) connects the electrode of the electronic component to the conductive layer (58A) on the interlayer resin insulation layer. The electrode for the ground of the capacitor is grounded via the connection via conductor.

(18) The processing in FIG. 11A to FIG. 12C is repeated, and the uppermost and lowermost interlayer resin insulation layers (50C, 50D) are formed on the interlayer resin insulation layers (50A, 50B), respectively. The uppermost and lowermost conductive layers (58C, 58D) are formed on the uppermost and lowermost interlayer resin insulation layers (50C, 50D), respectively. The uppermost and lowermost via conductors (60C, 60D) are formed in the uppermost and lowermost interlayer resin insulation layers (50C, 50D), respectively. The uppermost and lowermost via conductors (60C, 60D) connect the conductive layers (58A, 58B) to the conductive layers (58C, 58D), respectively (FIG. 12D). An upper buildup layer is formed on the first surface of the core substrate, and a lower buildup layer is formed on the second surface of the core substrate. Each buildup layer has an interlayer resin insulation layer and a via conductor for connecting the conductive layer to a different conductive layer. In the first embodiment, the upper buildup layer further has a connection via conductor. The upper buildup layer is formed on the first surface of the insulation substrate, and the lower buildup layer is formed on the second surface of the insulation substrate.

(19) The upper and lower solder-resist layers 70 having the openings 71 are formed on the upper and lower buildup layers, respectively (FIG. 13A). The opening 71 exposes the conductive layer and the upper surface of the via conductor. These portions function as pads, respectively. The upper solder-resist layer is formed on the upper buildup layer, and the lower solder-resist layer is formed on the lower buildup layer.

(20) A metal film 72 formed of a nickel layer and a gold layer on the nickel layer are formed on the pad (FIG. 13B). The metal film may be the nickel/gold layer or a nickel/palladium/gold layer. In the printed circuit board illustrated in FIG. 1, only the upper buildup layer has the connection via conductor. Therefore, the lower buildup layer may not have the conductive circuit under the electronic component. The inductance value is suppressed from lowering. When the lower buildup layer immediately under the electronic component does not have a conductive circuit, warping of the printed circuit board is likely to occur. In this case, the upper buildup layer preferably has an interlayer resin insulation layer having a greater thickness than that of the lower buildup layer. In another example, it is preferable that the interlayer resin insulation layer of the upper buildup layer does not have a reinforcing member, but that the interlayer resin insulation layer of the lower buildup layer has the reinforcing member. This reduces warping of the printed circuit board.

(21) Thereafter, the solder bump (76U) is formed on the pad of the upper buildup layer, and the solder bump (76D) is formed on the pad of the lower buildup layer. The printed circuit board 10 having the solder bumps is completed (FIG. 1).

The IC chip is mounted on the printed circuit board 10 through the solder bumps (76U) (not illustrated). Thereafter, the printed circuit board is mounted on the mother board through the solder bumps (76D).

Modification of First Embodiment

Figure 16:
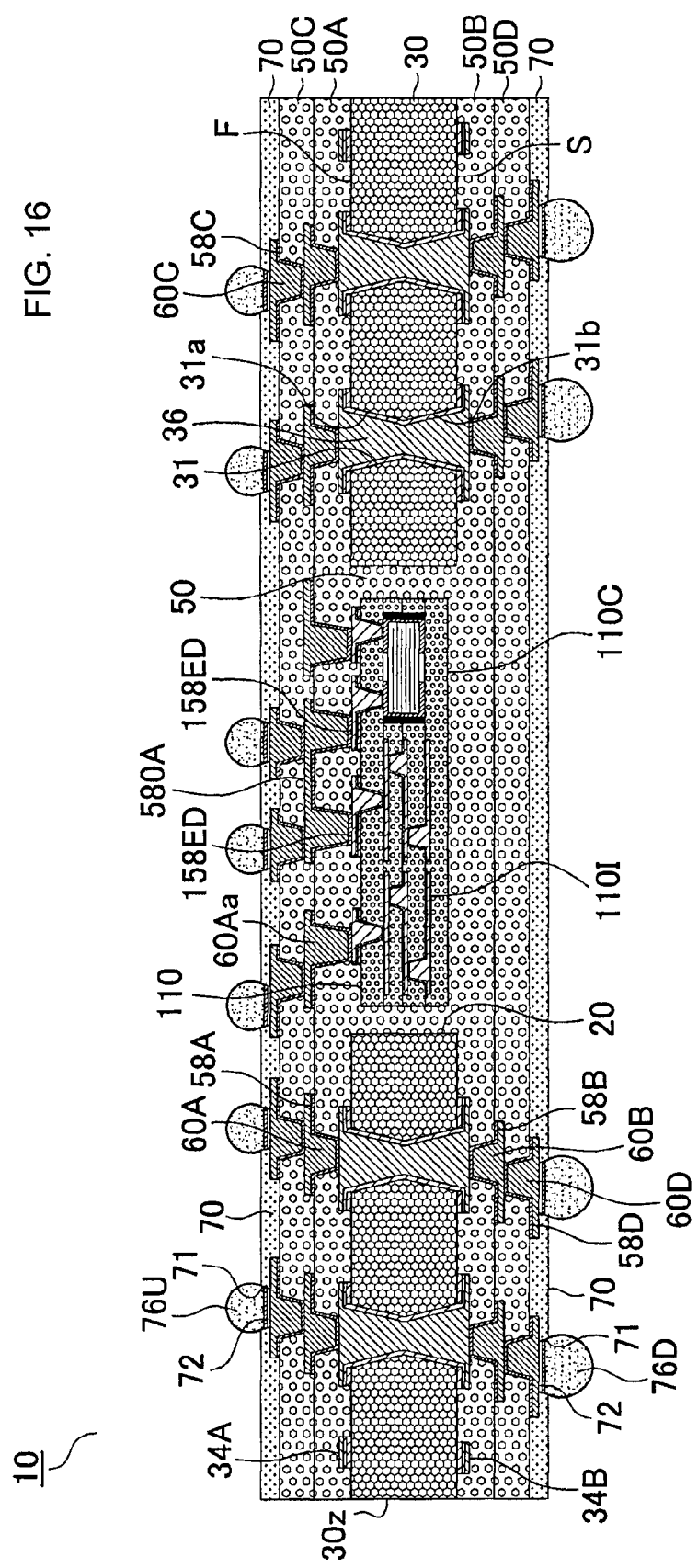
FIG. 16 is a cross-sectional view of a printed circuit board according to a modification of the first embodiment.

FIG. 16 illustrates a printed circuit board according to a modification of the first embodiment.

The electronic components illustrated in FIG. 8C is built into the printed circuit board of FIG. 16. In the electronic components illustrated in FIGS. 8C and 23A, the inductor is not connected to the passive component. When the built-in electronic component does not internally have a line connecting the inductor to the passive component, it is preferable that the passive components such as an inductor and a capacitor (chip capacitor) are connected by a conductive circuit (connection circuit) (580A) on an interlayer resin insulation layer formed on a core substrate. Parasitic capacitance decreases, and the malfunctioning of an IC chip decreases.

In the printed circuit board of the modification of the first embodiment, an output electrode of an inductor (110I) and a power supply electrode of a chip capacitor (110C) are connected through a connection via conductor (60Aa) and a connection circuit (580A). The connection circuit (580A) is formed on an interlayer resin insulation layer (upper interlayer resin insulation layer) formed directly on a first surface of the core substrate.

Second Embodiment

Figure 17:
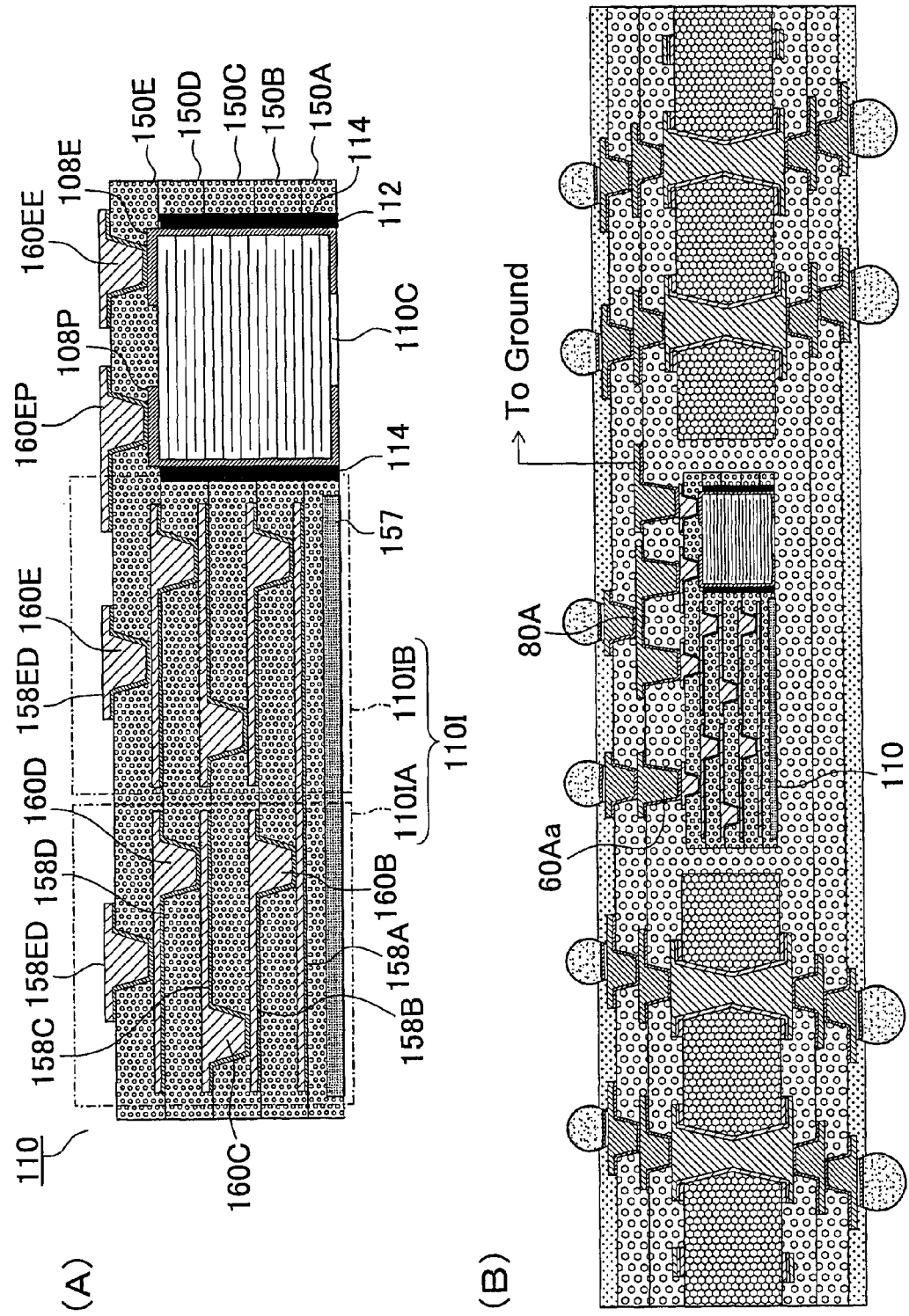
FIGS. 17(A)-17(B) are cross-sectional views of Example 1 of an electronic component and a printed circuit board with the built-in electronic component.

FIG. 17 is a cross-sectional view of an electronic component according to a second embodiment. This electronic component is accommodated in substantially the same printed circuit board as that of the first embodiment. Resin insulation layers (150A, 150B, 150C, 150D, 150E) of the electronic component of the second embodiment do not contain magnetic particles. The resin insulation layer of the electronic component of the second embodiment is made of inorganic particles of silica or the like and resin such as epoxy. On a lower surface of the lowermost resin insulation layer (150A), a magnetic layer 157 is formed under an inductor (110I). A magnetic film may be formed instead of the magnetic layer.

FIGS. 18 and 19 illustrate manufacturing steps of the electronic component of the second embodiment.

Preparation of Film for Resin Insulation Layer Containing Inorganic Particles (C) Preparation of Resin-Containing Solution Eighty-five grams of epoxy resin (manufactured by Japan Epoxy Resin Co., Ltd., brand name: "Epikote 1007" and the like) and inorganic particles of silica or the like are added to a mixture solvent of 6.8 g of MEK and 27.2 g of xylene. The inorganic particles do not contain magnetic particles.

(D) Preparation of Film for Resin Insulation Layer

As a curing agent, dicyandiamide (manufactured by PTI JAPAN Corp., brand name: "CG-1200" and others) and a curing catalyst (manufactured by Shikoku Chemicals Corporation, brand name: "Curezol 2E4 HZ" and others) are added to the resin-containing solution of the above (C). Thereafter, the mixture is kneaded by three rollers to form a solution for the resin insulation layer. An additional amount of each of the curing agent and the curing catalyst is 3.3 g per 100 g of epoxy.

The solution for the resin insulation layer is applied by a roll coater (manufactured by Cermatronics Boeki Co., Ltd.) onto a sheet of polyethylene terephthalate. The solution is dried at 160° C. for 5 minutes to remove the solvent. A film for the resin insulation layer containing the inorganic particles is obtained. It has a thickness of approximately 20 μm to 50 μm. The amount of the inorganic particles in the cured resin insulation layer is 30 vol. % to 60 vol. %.

On a support plate 170, a film for the resin insulation layer containing magnetic particles similar to those of the first embodiment is layered so that the magnetic layer 157 is formed (FIG. 18A). As illustrated in FIG. 18A, the film for the resin insulation layer containing the magnetic particles is smaller than the support plate. Depending on the size of the inductor, the film for the resin insulation layer containing the magnetic particles is formed on the support plate. The film for the resin insulation layer containing the magnetic particles is larger in size than the inductor. The outer periphery of the film for the resin insulation layer containing the magnetic particles is left exposed by the inductor. On the support plate of the magnetic layer 157, the film for the resin insulation layer of the above (D) is formed so that the lowermost resin insulation layer (150A) is formed (FIG. 18B). An electroless-plated film is formed on the lowermost resin insulation layer. A plating resist is formed on the electroless-plated film. An electrolytic-plated film is formed on the electroless-plated film left exposed by the plating resist. The plating resist is removed. The electroless-plated film between portions of the electrolytic-plated film is removed. A lowermost coil layer (158A) is formed. The resin insulation layer (150B) is formed on the lowermost resin insulation layer (150A) and the lowermost coil layer (158A). A via-conductor opening is formed in the resin insulation layer (150B). A coil layer is formed on the resin insulation layer (150B) by substantially the same method as that of forming the lowermost coil layer. Simultaneously, coil layers in different layers are connected by via conductors. Substantially the same method is repeated to form the four coil layers. Thereafter, the support plate is removed, and a multilayered product is completed (FIG. 19A). Beside the inductor, an opening 112 penetrating through all the resin insulation layers is formed in the multilayered product (FIG. 19B). A tape 170 is adhered to the multilayered product. The opening 112 is covered by the tape (FIG. 19C). Subsequent steps are substantially the same as those in FIG. 30 and those related to them.

A method for manufacturing the printed circuit board of the second embodiment is substantially the same as that of the first embodiment.

Third Embodiment

FIG. 20A illustrates a cross section of an electronic component of a third embodiment, and FIG. 20B illustrates a top view.

An electronic component 210 of the third embodiment has two inductors and two passive components. The passive components are a chip and a resistor. In FIG. 20B, the two central components are inductors, and the outer two components are chip capacitors. These components are molded with resin (2500M). The inductor of the third embodiment is substantially the same as the inductor already described in the first embodiment. An inductor on the left in FIG. 20 is a first inductor (210L1), and an inductor on the right is a second inductor (210L2). A chip capacitor on the left in FIG. 20 is a first chip capacitor (210C1), and a chip capacitor on the right is a second chip capacitor (210C2).

Similarly to the other embodiments, the first and second inductors have input electrodes (L1I, L2I), and output electrodes (L1O, L2O), respectively. The output electrodes of the first and second inductors are connected to a common circuit.

Power reaches the input electrode of the inductor through a connection via conductor in the printed circuit board. The power is externally output from the inductor through the output electrode of the inductor. In FIG. 20A, the first and second inductors are connected to one circuit, which includes a conductor 236 penetrating the electronic component, lines (258A, 258B) on the electronic component, and via conductors (260A, 260B) connecting the lines (258A, 258B) to the inductors or the passive components. This circuit reaches power supply electrodes (C1P, C2P) of the capacitors. As illustrated in FIG. 20C, this circuit is connected to a solder bump (760U) for mounting an IC chip via a connection via conductor. The solder bump (760U) is formed on the power supply pad. In FIG. 20C, the connection via conductor is connected to a circuit intersection (via pad) (OUTA) extending from the output electrodes of the first and second inductors.

In FIG. 20C, first and second chip capacitors (210C1, 210C2) are arranged between a power supply line extending through the inductors to a power supply of the IC chip and a ground. The first and second chip capacitors (210C1, 210C2) are arranged in parallel between the power supply line and the ground.

In FIG. 20C, a connection via conductor inside an upper buildup layer connects the power supply line in the printed circuit board to the electronic component arranged inside the core substrate. Further, a connection via conductor inside a lower buildup layer connects the ground to ground electrodes (GND1, GND2) of the chip capacitors arranged inside the core substrate as well as to ground electrodes (C1E, C2E) of the chip capacitors. The printed circuit boards described in the first and second embodiments and the respective modifications may employ the substantially same connection method.

Figure 21:
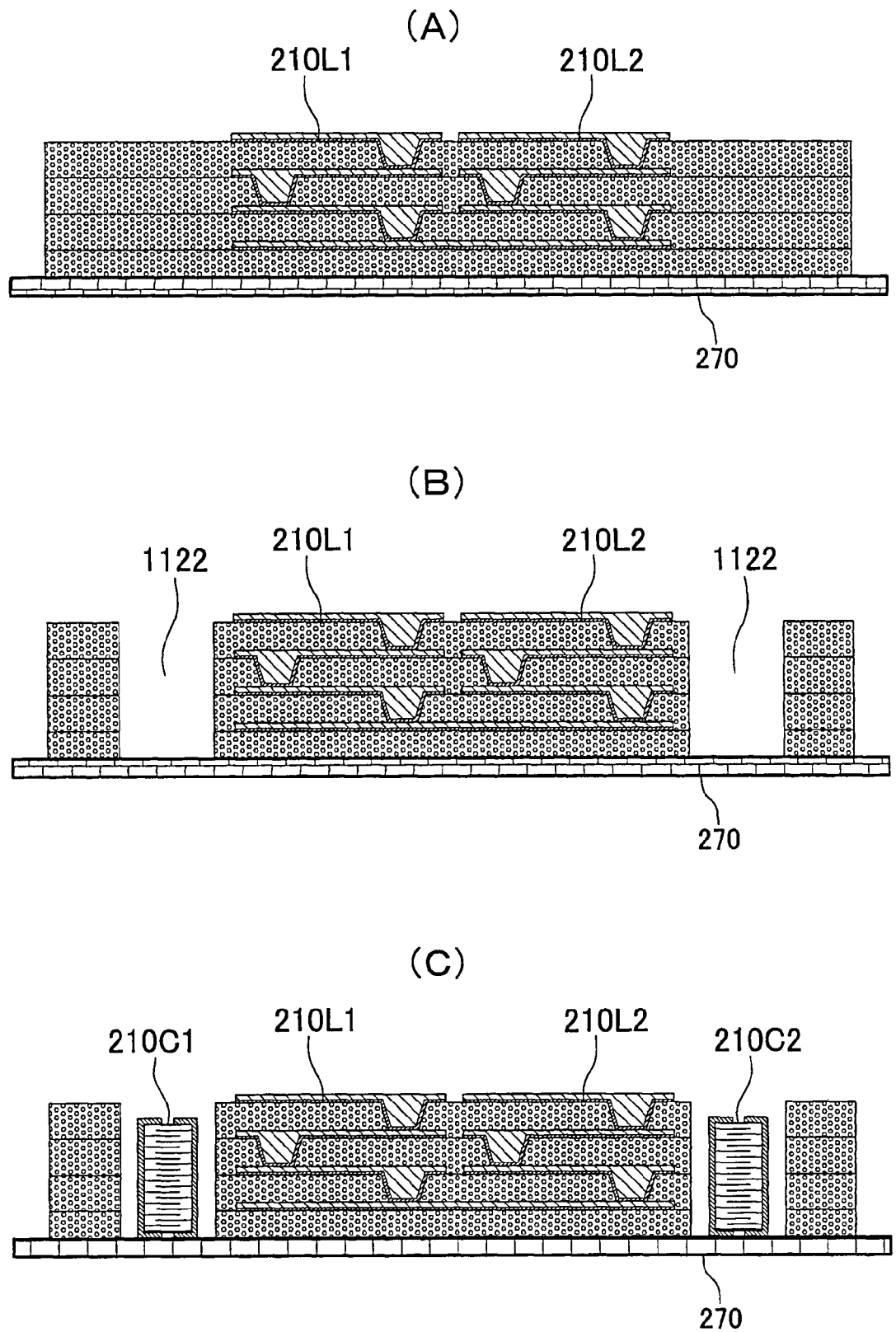
FIGS. 21(A)-21(C) are process views illustrating a method for manufacturing the electronic component of the third embodiment.

FIGS. 21 and 22 illustrate a method for manufacturing the electronic component of the third embodiment.

The electronic component of the third embodiment is manufactured by substantially the same method as the first embodiment.

Two laminated coils are formed in a central portion of the support plate (FIG. 21A). The laminated coil is manufactured in substantially the same manner as that of the first embodiment.

Two openings (1122) for accommodating the chip capacitors are formed in the resin insulation layer portions outside the laminated coil, respectively (FIG. 21B). The opening penetrates through each resin insulation layer.

The chip capacitor is arranged in each opening (FIG. 21C).

The chip capacitors and the inductors are molded with resin, similar to the first embodiment (FIG. 22A). A resin insulation layer (250A) is formed on the inductors, the chip capacitors, and the resin insulation layer. Resin for fixing is filled in a space between the chip capacitor and a side wall of the resin insulation layer exposed through the opening 1122.

The support plate is removed (FIG. 22B). A resin insulation layer (250B) is formed on a surface exposed by removing the support plate (FIG. 28B). A through hole penetrating through the resin insulation layer is formed for a through-hole conductor by laser. Via-conductor openings are formed in the resin insulation layers (250A, 250B), respectively. The through-hole conductor 236 is formed in the through hole for the through-hole conductor. Via conductors (260A, 260B) are formed in the via-conductor openings, respectively. The electronic component 210 is completed (FIG. 20A).

In the electronic component of the third embodiment, one of the electrodes (C1E, C2E) of the chip capacitor is grounded, and the other electrode (C1P or C2P) is connected to the output electrode of the inductor and a power transmission circuit in the printed circuit board. The input electrode of the inductor is connected to the power supply line in the printed circuit board.

When the inductor and the passive component are connected together inside the electronic component, the wiring for a filter is nearly completed so that the electronic component of the embodiment can be easily used as the filter.

Even when the inductor and the passive component are not connected together inside the electronic component, these can be connected together by a short line through the connection via conductors inside the printed circuit board. For example, the short line is 100 μm to 400 μm in length. Therefore, when the electronic component of the embodiment is built into a printed circuit board, the electronic component of the embodiment functions as the filter without difficulty.

The coefficient of thermal expansion of the built-in electronic component in each of the embodiments and modifications is preferably higher in value than that of the insulation substrate. The value of the coefficient of thermal expansion is a value in a (Y-Y) direction.

In each of the embodiments and modifications, it is preferable that the coil layers in the electronic component overlap. Specifically, when the coil layers are projected onto the first surface of the core substrate with a magnification of 1×, images of these coil layers overlap.

The printed circuit board of each of the embodiments and modifications has a built-in electronic component formed of an inductor and a passive component such as a capacitor. The inductor is placed beside the passive component. Therefore, the height of the electronic component is short. The insulation substrate for accommodating the electronic component has a small thickness. The printed circuit board has a small thickness. Since a distance between the inductor and the passive component is short, a parasitic capacitance decreases.

In each of the embodiments and modifications, the inductor and the passive component can be connected through the via conductors. The connection reliability between the inductor and the passive component increases. In each of the embodiments and modifications, the inductor is a laminated coil.

The electronic component having high impedance does not hinder formation of wiring of the printed circuit board.

In each of the embodiments and modifications, the electronic component formed of the inductor and the passive component is built into one opening. When the inductor and the passive component are built into different openings, respectively, a rate of a volume occupied by the openings with respect to the core substrate volume increases. Warping of the printed circuit board increases. However, in each of the embodiments and modifications, the inductor and the passive component are integrated, and are built into one opening. Therefore, the rate of a volume occupied by the opening with respect to the core substrate volume is small. Warping of the printed circuit board is minor.

When an inductor and a capacitor are formed in different insulation layers, respectively, such a structure is thought to cause the substrate to be thicker. Also, it is considered that a distance between the inductor and the capacitor is long. Thus, a resistance value is thought to increase. Further, it is thought that the electrical characteristics of a circuit having the inductor and the capacitor are lowered. When an inductor is formed in a multilayer printed circuit board, it is thought that electrical characteristics of the inductor and a capacitor are affected by a design of the multilayer printed circuit board. Ensuring the electrical characteristics such as a Q value of the inductor and others is thought to be difficult.

An electronic component according to an embodiment of the present invention is suitable for removing noises. A printed circuit board according to an embodiment of the present invention can stably supply power to an IC chip. A printed circuit board according to an embodiment of the present invention reduces the thickness with a built-in electronic component formed of multiple components. A manufacturing method according to an embodiment of the present invention accommodates an electronic component formed of multiple components in a printed circuit board.

A printed circuit board according to an embodiment of the invention includes: a core substrate having a first surface and a second surface opposite the first surface, and having an opening for accommodating an electronic component; an electronic component accommodated in the opening, and formed of multiple components; a filler resin formed in a space between the side surface of the core substrate exposed through the opening and the electronic component; an upper buildup layer formed of an upper interlayer resin insulation layer formed on the first surface of the core substrate and the electronic component, an upper conductive layer formed on the upper interlayer resin insulation layer, and an upper via conductor formed in the upper interlayer resin insulation layer; and a lower buildup layer formed of a lower interlayer resin insulation layer formed on the second surface of the core substrate and the electronic component, a lower conductive layer formed on the lower interlayer resin insulation layer, and a lower via conductor formed in the lower interlayer resin insulation layer.

One of the multiple components is an inductor, and another component is a passive component. The inductor and the passive component are connected together via a line.

A method for manufacturing a printed circuit board according to another embodiment of the invention includes: forming an opening for accommodating an electronic component in an insulation substrate having a first surface and a second surface opposite the first surface; in the opening, accommodating an electronic component to be built into the printed circuit board, the electronic component being formed of an inductor having a resin insulation layer and a coil layer on the resin insulation layer, a capacitor, and resin integrating the inductor and the capacitor; and on the first surface of the insulation substrate and on the electronic component, forming an upper buildup layer formed of an upper interlayer resin insulation layer, an upper conductive layer, and an upper via conductor; and on the second surface of the core substrate and on the electronic component, forming a lower buildup layer formed of a lower interlayer resin insulation layer, a lower conductive layer, and a lower via conductor.

Obviously, numerous modifications and variations of the present invention are possible in light of the above teachings. It is therefore to be understood that within the scope of the appended claims, the invention may be practiced otherwise than as specifically described herein.

What is claimed is:

1. A printed circuit board, comprising:
   a core substrate;
   an electronic component device comprising an inductor component and a passive component forming a low pulse filter for an IC chip such that the low pulse filter is accommodated in a single opening portion formed in the core substrate;
   a wiring structure connecting the inductor component and the passive component in the electronic component device;
   a filler resin body filling a space formed between the core substrate and the electronic component device positioned in the opening portion of the core substrate;
   a first buildup layer comprising a first interlayer resin insulation layer formed on a first surface of the core substrate, a first conductive layer formed on the first interlayer resin insulation layer, and a first via conductor formed in the first interlayer resin insulation layer; and
   a second buildup layer comprising a second interlayer resin insulation layer formed on a second surface of the core substrate on an opposite side with respect to the first surface of the core substrate, a second conductive layer formed on the second interlayer resin insulation layer, and a second via conductor formed in the second interlayer resin insulation layer,
   wherein the wiring structure comprises a connection circuit portion formed on the first interlayer resin insulation layer and a plurality of connection via conductors formed through the first interlayer resin insulation layer and connected to the connection circuit portion such that a first connection via conductor of the connection via conductors is connected to an output electrode of the inductor component and a second connection via conductor of the connection via conductors is connected to a power source electrode of the passive component.

2. The printed circuit board according to claim 1, wherein the passive component includes one of a capacitor component and a resistor component.

3. The printed circuit board according to claim 1, wherein the inductor component of the electronic component device comprises a plurality of coil layers and a plurality of resin insulation layers such that the coil layers and the resin insulation layers are alternately laminated.

4. The printed circuit board according to claim 1, wherein the inductor component comprises a plurality of coil layers, a resin insulation layer interposed between the coil layers, and a via conductor formed in the resin insulation layer such that the via conductor is connecting the coil layers.

5. The printed circuit board according to claim 1, wherein the filler resin body includes magnetic particles.

6. The printed circuit board according to claim 1, wherein the passive component of the electronic component device is a capacitor component.

7. The printed circuit board according to claim 1, wherein the electronic component device comprises the inductor component, the passive component and a resin body integrating the inductor component and the passive component.

8. The printed circuit board according to claim 1, wherein the wiring structure has a wiring length extending between the output electrode of the inductor component and the power source electrode of the passive component such that the wring length of the wiring structure is 500 µm or less.

9. The printed circuit board according to claim 3, wherein the plurality of resin insulation layers in the inductor component includes magnetic particles.

10. The printed circuit board according to claim 3, wherein the passive component of the electronic component device is a capacitor component.

11. The printed circuit board according to claim 4, wherein the inductor component includes a magnetic layer interposed between the resin insulation layer and one of the coil layers, and the magnetic layer has an aperture portion surrounding the via conductor.

12. The printed circuit board according to claim 6, wherein the wiring structure has a wiring length extending between the output electrode of the inductor component and the power source electrode of the passive component such that the wring length of the wiring structure is 500 µm or less.

13. The printed circuit board according to claim 11, wherein the magnetic layer of the inductor component comprises a resin material and magnetic particles.

14. The printed circuit board according to claim 10, wherein the wiring structure has a wiring length extending between the output electrode of the inductor component and the power source electrode of the passive component such that the wring length of the wiring structure is 500 µm or less.

15. A method for manufacturing a printed circuit board, comprising:
   accommodating an electronic component device comprising an inductor component and a passive component forming a low pulse filter for an IC chip such that the low pulse filter is accommodated in a single opening portion formed in an insulation substrate;
   filling a filler resin material in a space formed between the insulation substrate and the electronic component device positioned in the opening portion of the insulation substrate such that a filler resin body is formed in the space between the insulation substrate and the electronic component device in the opening portion of the insulation substrate;
   forming on a first surface of the insulation substrate a first buildup layer comprising a first interlayer resin insulation layer, a first conductive layer formed on the first interlayer resin insulation layer, and a first via conductor formed in the first interlayer resin insulation layer; and
   forming on a second surface of the core substrate on an opposite side with respect to the first surface of the insulation substrate a second buildup layer comprising a second interlayer resin insulation layer, a second conductive layer formed on the second interlayer resin insulation layer, and a second via conductor formed in the second interlayer resin insulation layer,
   wherein the forming of the first buildup layer comprises forming a wiring structure comprising a connection circuit portion formed on the first interlayer resin insulation layer and a plurality of connection via conductors formed through the first interlayer resin insulation layer and connected to the connection circuit portion such that a first connection via conductor of the connection via conductors is connected to an output electrode of the inductor component and a second connection via conductor of the connection via conductors is connected to a power source electrode of the passive component.

16. The method for manufacturing a printed circuit board according to claim 15, wherein the inductor component comprises a plurality of resin insulation layers and a plurality of coil layers formed on the resin insulation layers, respectively, and the passive component is a capacitor component.

17. The method for manufacturing a printed circuit board according to claim 15, wherein the passive component in the electronic component device is a capacitor component.

18. The method for manufacturing a printed circuit board according to claim 15, wherein the wiring structure is formed such that the wiring structure has a wiring length extending between the output electrode of the inductor component and the power source electrode of the passive component and that the wiring length of the wiring structure is 500 µm or less.

* * * * *